: US010361217B2

(12) United States Patent
Kim

(10) Patent No.: US 10,361,217 B2
(45) Date of Patent: Jul. 23, 2019

(54) VERTICAL MEMORY DEVICES

(71) Applicant: SAMSUNG ELECTRONICS CO., LTD., Suwon-si, Gyeonggi-do (KR)

(72) Inventor: Chan-Ho Kim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/833,342

(22) Filed: Dec. 6, 2017

(65) Prior Publication Data

US 2018/0182776 A1 Jun. 28, 2018

(30) Foreign Application Priority Data

Dec. 22, 2016 (KR) .................. 10-2016-0176705

(51) Int. Cl.
*H01L 21/02* (2006.01)
*H01L 21/28* (2006.01)
(Continued)

(52) U.S. Cl.
CPC .. *H01L 27/11582* (2013.01); *H01L 21/02532* (2013.01); *H01L 21/02647* (2013.01); *H01L 21/28282* (2013.01); *H01L 23/528* (2013.01); *H01L 27/11565* (2013.01); *H01L 29/1037* (2013.01); *H01L 29/4234* (2013.01); *H01L 29/513* (2013.01); *H01L 29/518* (2013.01); *H01L 29/66833* (2013.01); *H01L 29/7926* (2013.01); *H01L 21/0217* (2013.01); *H01L 21/0273* (2013.01); *H01L 21/02164* (2013.01); *H01L 21/02271* (2013.01); *H01L 21/02592* (2013.01); *H01L 21/02595* (2013.01); *H01L 21/02598* (2013.01); *H01L 21/31144* (2013.01);
(Continued)

(58) Field of Classification Search
CPC combination set(s) only.
See application file for complete search history.

(56) References Cited

U.S. PATENT DOCUMENTS 7,867,831 B2 1/2011 Shin et al.
8,334,551 B2 12/2012 Itagaki et al.
(Continued)

FOREIGN PATENT DOCUMENTS

JP 5086959 11/2012
KR 100985881 9/2010

*Primary Examiner* — Telly D Green
(74) *Attorney, Agent, or Firm* — F. Chau & Associates, LLC

(57) ABSTRACT

A vertical memory device includes a mold structure and channels. The mold structure includes gate electrodes and insulation patterns arranged on a substrate in which the gate electrodes are disposed at a plurality of levels, respectively, in a vertical direction substantially perpendicular to an upper surface of the substrate. The insulation patterns are disposed between neighboring ones of the gate electrodes. The channels extend through the mold structure in the vertical direction in a hole, and are spaced apart from each other in a horizontal direction substantially parallel to the upper surface of the substrate in the hole. The gate electrodes each includes a plurality of first gate electrodes spaced apart from each other substantially horizontally. The hole extends through one of the first gate electrodes included in each of the gate electrodes. A plurality of channels may be formed in the one hole in the one first gate electrode.

20 Claims, 29 Drawing Sheets

(51) Int. Cl.
  *H01L 29/10*      (2006.01)
  *H01L 29/49*      (2006.01)
  *H01L 29/51*      (2006.01)
  *H01L 29/66*      (2006.01)
  *H01L 21/027*     (2006.01)
  *H01L 21/311*     (2006.01)
  *H01L 23/528*     (2006.01)
  *H01L 29/423*     (2006.01)
  *H01L 29/792*     (2006.01)
  *H01L 27/1157*    (2017.01)
  *H01L 27/11565*   (2017.01)
  *H01L 27/11582*   (2017.01)

(52) U.S. Cl.
  CPC ....... *H01L 27/1157* (2013.01); *H01L 29/4966* (2013.01); *H01L 29/517* (2013.01)

(56) References Cited

U.S. PATENT DOCUMENTS

| | | | | |
|---|---|---|---|---|
| 9,147,681 | B2 | 9/2015 | Liu | |
| 9,219,074 | B2 | 12/2015 | Chen | |
| 9,484,354 | B2 * | 11/2016 | Lee | H01L 27/11573 |
| 9,698,151 | B2 * | 7/2017 | Lee | H01L 27/11565 |
| 9,793,291 | B2 * | 10/2017 | Shin | H01L 27/11582 |
| 9,859,296 | B2 * | 1/2018 | Park | H01L 27/11582 |
| 10,090,314 | B2 * | 10/2018 | Lee | H01L 27/11565 |
| 2015/0115345 | A1 * | 4/2015 | Nowak | H01L 27/11582 257/314 |
| 2015/0221666 | A1 | 8/2015 | Lee | |
| 2015/0263016 | A1 | 9/2015 | Cha | |
| 2015/0303214 | A1 * | 10/2015 | Kim | H01L 27/11582 257/329 |
| 2015/0348987 | A1 * | 12/2015 | Lee | H01L 27/11573 257/326 |
| 2016/0071861 | A1 | 3/2016 | Serov et al. | |
| 2016/0071876 | A1 | 3/2016 | Mizuno et al. | |
| 2016/0343729 | A1 * | 11/2016 | Shin | H01L 27/11582 |
| 2017/0025430 | A1 * | 1/2017 | Lee | H01L 27/11573 |
| 2017/0069636 | A1 * | 3/2017 | Park | H01L 27/11582 |
| 2017/0103993 | A1 * | 4/2017 | Lee | H01L 27/11565 |
| 2017/0103998 | A1 * | 4/2017 | Chang | H01L 21/26513 |
| 2017/0271351 | A1 * | 9/2017 | Lee | H01L 27/11565 |
| 2018/0211968 | A1 * | 7/2018 | Lee | H01L 27/11565 |

* cited by examiner

FIG. 1
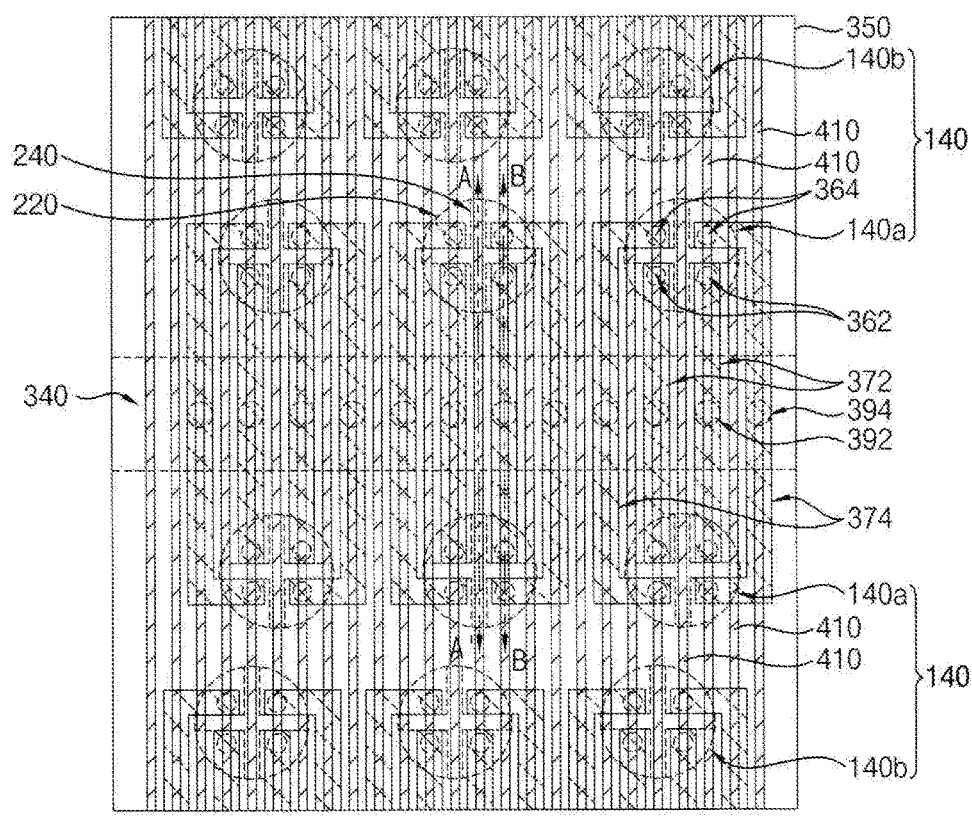
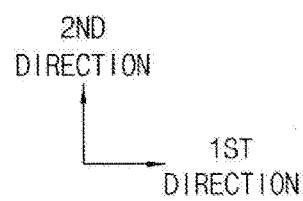

FIG. 6
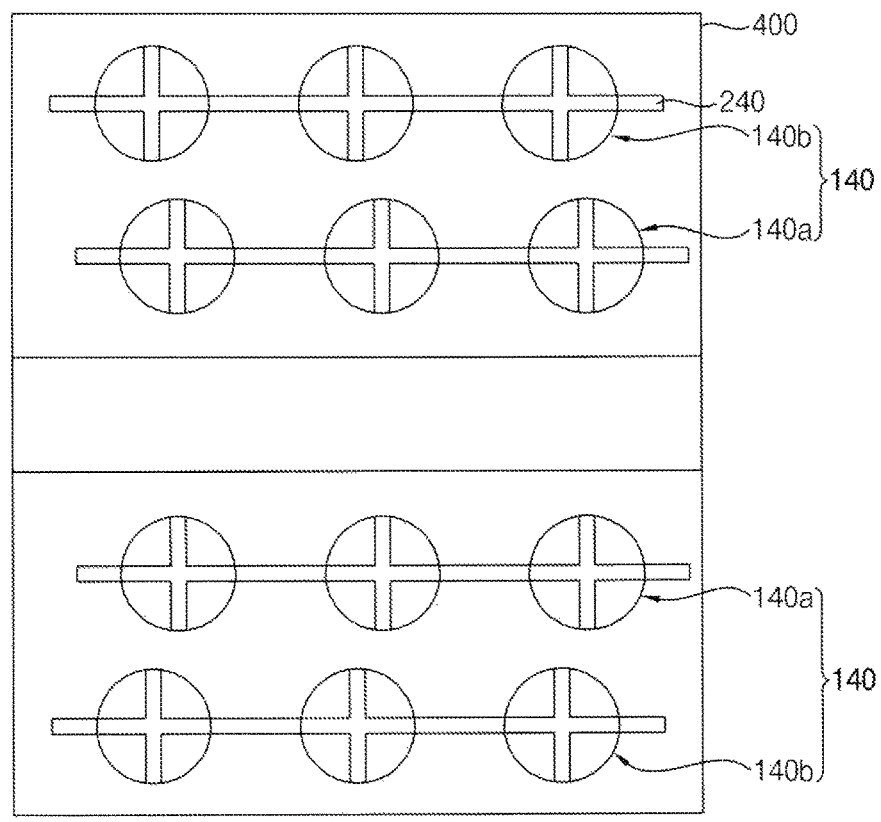
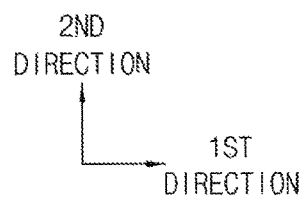

FIG. 7
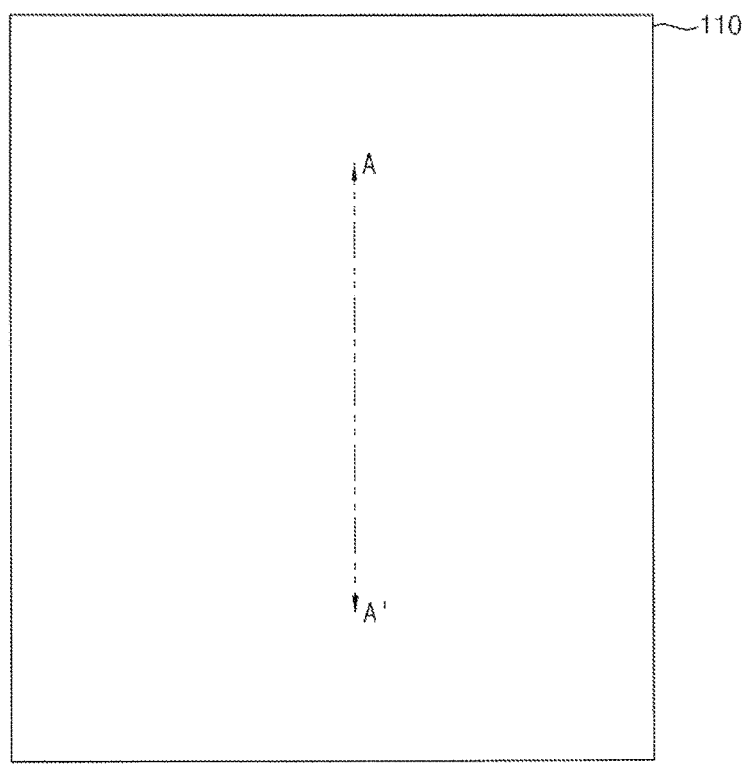
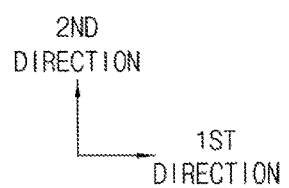

FIG. 11
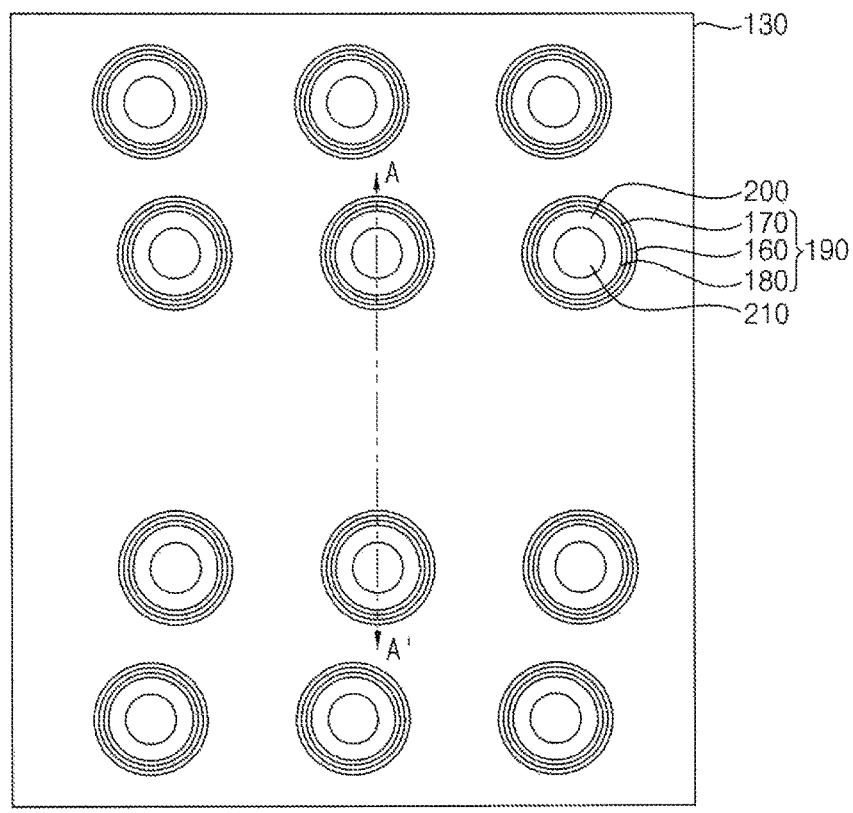
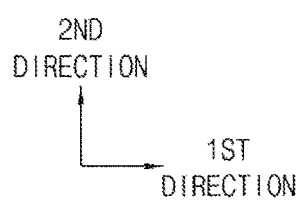

VERTICAL MEMORY DEVICES

CROSS-REFERENCE TO RELATED APPLICATIONS

This application claims priority under 35 U.S.C. § 119 from Korean Patent Application No, 10-2016-0176705, filed on Dec. 22, 2016 in the Korean Intellectual Property Office (KIPO), the contents of which are incorporated by reference herein.

TECHNICAL FIELD

The inventive concepts generally relate to vertical memory devices, and more particularly, the inventive concepts relate to vertical non-volatile memory devices including vertically extending channels.

DISCUSSION OF THE RELATED ART

As the number of steps vertically stacked in a VNAND flash memory device increases, it becomes more difficult to form channel holes due to the high aspect ratio thereof. Moreover, if the widths of the channel holes are increased, in this case, an area of the VNAND flash memory device increases.

SUMMARY

Example embodiments of the inventive concept provide a vertical memory device having enhanced characteristics.

According to an embodiment of the inventive concept, there is provided a vertical memory device. The vertical memory device may include a mold structure and a plurality of channels. The mold structure may include gate electrodes and insulation patterns disposed on a substrate. The gate electrodes may be disposed at a plurality of levels, respectively, in a vertical direction substantially perpendicular to an upper surface of the substrate, and the insulation patterns may be disposed between neighboring ones of the gate electrodes. The channels may extend through the mold structure in the vertical direction in a hole, and may be spaced apart from each other in a horizontal direction substantially parallel to the upper surface of the substrate in the hole. Each of the gate electrodes may include a plurality of first gate electrodes spaced apart from each other in the horizontal direction. The hole may extend through one of the plurality of first gate electrodes included in each of the gate electrodes.

According to an embodiment of the inventive concept, a division pattern extends through the hole of one of the first gate electrodes and divides the hole into a plurality of subchannels.

According to an embodiment of the inventive concept, there is provided a vertical memory device. The vertical memory device may include gate electrodes and channels. The gate electrodes may be formed at a plurality of levels from an upper surface of a substrate in a vertical direction substantially perpendicular to the upper surface of the substrate, and each of the gate electrodes may include a plurality of first gate electrodes disposed in a horizontal direction substantially parallel to the upper surface of the substrate. The channels may extend through one of the first gate electrodes included in each of the gate electrodes in the vertical direction on the substrate, and the channels may directly contact an insulating division pattern and may be spaced apart from each other by the insulating division pattern.

According to an embodiment of the inventive concept, a vertical memory device includes: a substrate; a mold structure disposed on the substrate, the mold structure including gate electrodes disposed at a plurality of levels, respectively, in a vertical direction substantially perpendicular to an upper surface of the substrate, and insulation patterns disposed between neighboring ones of the gate electrodes, wherein the mold structure has a plurality of channel holes formed in the vertical direction. Each of the gate electrodes includes a plurality of first gate electrodes arranged on a respective one of the plurality of levels and spaced apart from each other, and wherein one of the plurality of channel holes extends through a respective first gate electrode of the plurality of first gate electrodes; and a division pattern is respectively arranged to form a plurality of channels in the channel hole in the respective first gate electrode of the plurality of first gate electrodes.

The division pattern may include an insulating material. In addition, each of the gate electrodes may further include a plurality of second gate electrodes and a plurality of third gate electrodes, wherein a respective first gate electrode, second gate electrode and third gate electrode of each gate electrode are sequentially stacked.

The first gate electrode, the second gate electrode, and the third gate electrode may comprise a ground selection line, a word line, and a string selection line, respectively.

The first gate electrode, the second gate electrode and the third gate electrode are formed at the plurality of levels, respectively.

The first gate electrode, the second gate electrode and the third gate electrode may be formed at a single level of the plurality of levels.

The first gate electrode may include a first gate conductive pattern, and a first gate barrier pattern covering lower and upper surfaces and a portion of a sidewall of the first gate conductive pattern.

In the vertical memory device in accordance with example embodiments of the inventive concept, one channel may be formed in each channel hole, and the channel may be divided into a plurality of pieces by forming a division pattern. Thus, the density of the channel may increase without increasing the area of the vertical memory device. Alternatively, when the vertical memory device has a channel density substantially the same as that of a vertical memory device including one channel in each channel hole, each of the channel holes may increase, and thus failure may be prevented due to an increase of the aspect ratio.

BRIEF DESCRIPTION OF THE DRAWINGS

FIG. 1 is a plan illustrating a first vertical memory device in accordance with example embodiments of the inventive concept;

FIG. 6 is a plan view illustrating a layout of a division pattern of a second vertical memory device in accordance with example embodiments of the inventive concept;

FIG. 7 is a plan view of an insulation layer that is one of a plurality of drawings illustrating stages of a method of manufacturing a vertical memory device in accordance with example embodiments of the inventive concept;

FIGS. 11 and 12 show a semiconductor pattern after removing the first mask;

DETAILED DESCRIPTION

The above inventive concept will become more readily understood and appreciated by a person of ordinary skill in the art from the detailed description that follows, with reference to the accompanying drawings.

Figure 2:
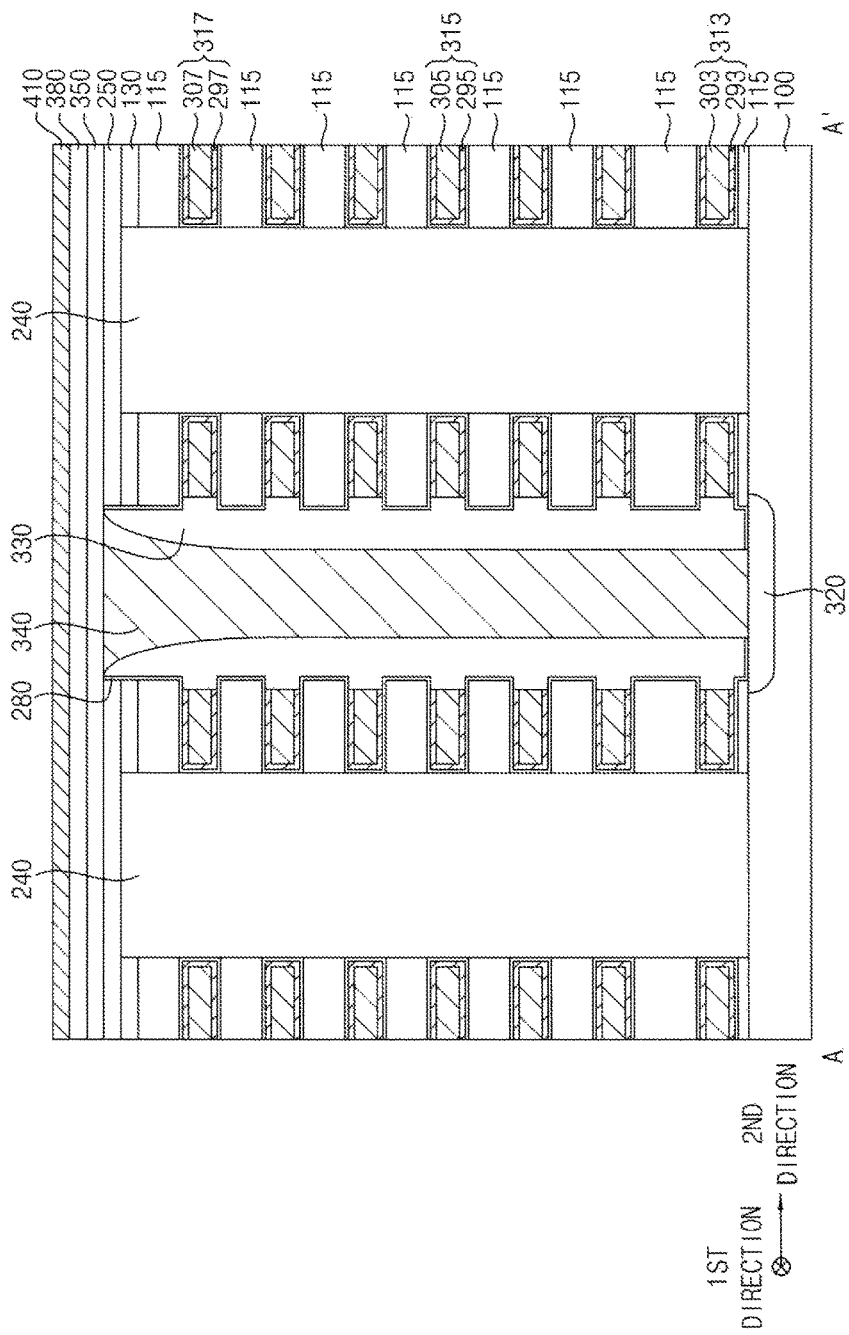
FIG. 2 is a cross-sectional view of FIG. 1 taken along line A-A'.
Figure 3:
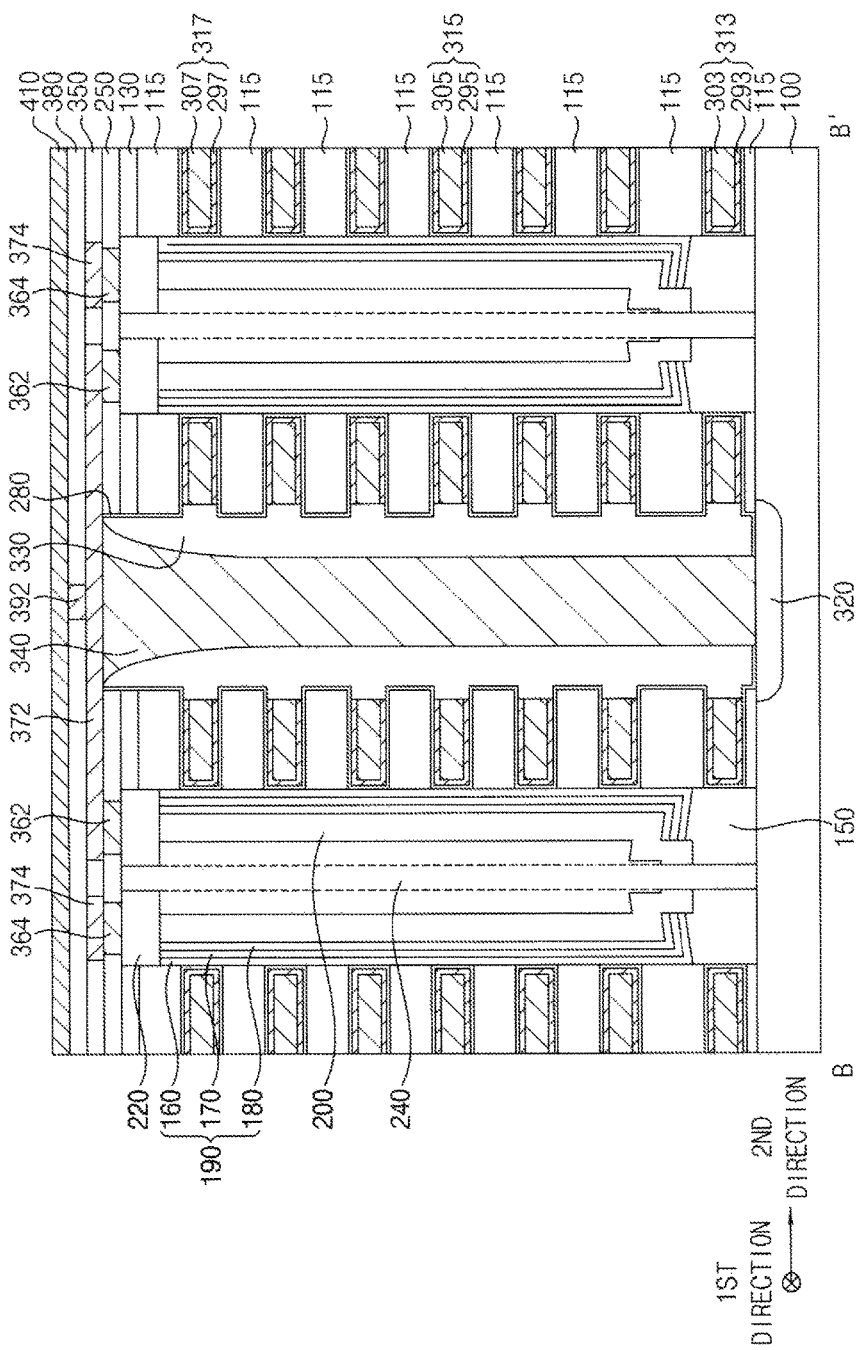
FIG. 3 is a cross-sectional view of FIG. 1 taken along line B-B'.
Figure 4:
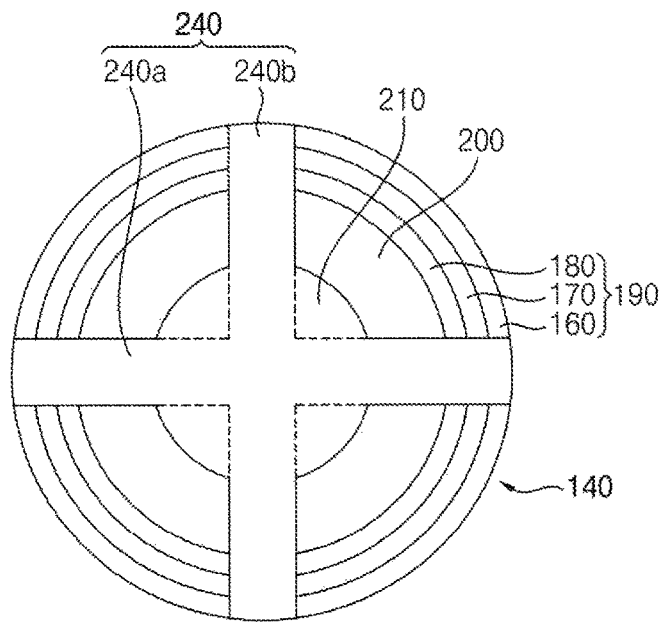
FIG. 4 is a plan view illustrating a first structure and a division pattern of the first vertical memory device.
Figure 5:
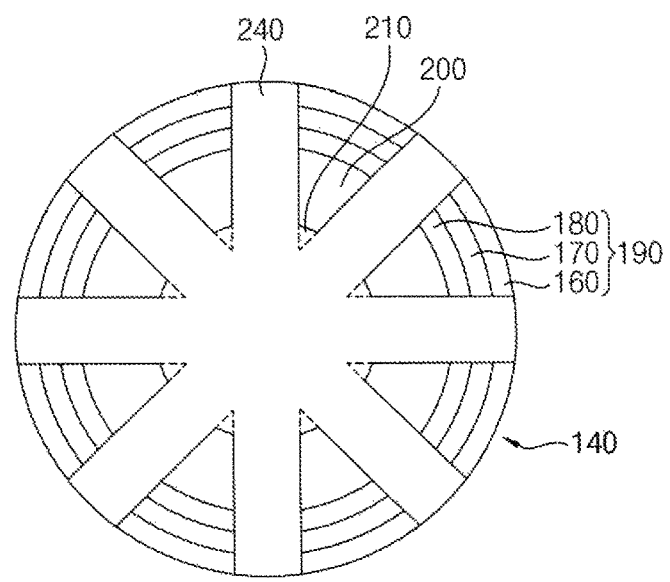
FIG. 5 is a plan view showing a second structure that is divided into a plurality of pieces in one channel hole.

FIGS. 1 to 5 are plan views and cross-sectional views illustrating a first vertical memory device in accordance with example embodiments of the inventive concept, and FIG. 6 is a plan view illustrating a layout of a division pattern of a second vertical memory device in accordance with example embodiments of the inventive concept. FIGS. 2 and 3 are cross-sectional views taken along lines A-A' and B-B', respectively, of FIG. 1, and FIGS. 4 and 5 are plan views illustrating a first structure and a division pattern of the first vertical memory device.

Hereinafter, a direction substantially perpendicular to an upper surface of a substrate may be referred to as a "vertical direction", and directions substantially parallel to the upper surface of the substrate may be referred to as a "horizontal direction". Among the horizontal directions, two directions crossing each other may be referred to as a first direction and a second direction, respectively. Several of the drawings include a key with the orientation of the two horizontal directions (first direction and second direction) shown. In some of the embodiments, the first direction and the second direction may be substantially perpendicular to each other.

Referring to FIGS. 1 to 5, the first vertical memory device may include a mold structure, a second structure, a division pattern 240, and a first wiring, second wiring and third wiring 372, 374 and 410 (FIG. 3) on a substrate 100. The first vertical memory device may further include a second blocking layer 280, an impurity region 320, a common source line (CSL) 340, a second spacer 330, first to fifth insulating interlayers 130, 250, 350, 380 and 400, and first to fourth vias 362, 364, 392 and 394.

The substrate 100 may include, for example, silicon, germanium, silicon-germanium or a III-V compound such as GaP, GaAs, GaSb, etc. In some embodiments of the inventive concept, the substrate 100 may be formed of a silicon-on-insulator (SOT) substrate or a germanium-on-insulator (GOI) substrate.

The mold structure may include, for example, gate electrodes 313, 315, 317 at a plurality of levels, respectively, in the vertical direction on the substrate 100, and insulation patterns 115 respectively disposed between neighboring ones of the gate electrodes. In example embodiments, the mold structure may have a staircase shape including a plurality of steps each including the gate electrode and the insulation pattern 115, and the steps of the mold structure may have areas that decrease as the steps ascend from a lower level toward an upper level. However, the inventive concept is not limited to a mold structure having a staircase shape.

The mold structure may include an insulating interlayer structure arranged between the gate electrodes, and the sidewall of the mold may have an insulating interlayer pattern thereon.

In example embodiments of the inventive concept, the gate electrode at each level may extend in the first direction, and a plurality of gate electrodes may be formed in the second direction at each level. The plurality of gate electrodes extending in the first direction may be spaced apart from each other in the second direction by the CSL 340 and the second spacer 330.

The gate electrode may include first, second and third gate electrodes 313, 315 and 317 sequentially stacked at a plurality of levels, respectively. The first gate electrode 313 may serve as a ground selection line (GSL), the second gate electrode 315 may serve as a word line, and the third gate electrode 317 may serve as a string selection line (SSL). Each of the first, second and third gate electrodes 313, 315 and 317 may be formed at a single level or a plurality of levels, respectively. One or a plurality of dummy word lines may be formed between the first and second gate electrodes 313 and 315 and/or between the second and third gate electrodes 315 and 317. The quantity of dummy word lines between the first and second gate electrodes 313, 315 and/or between the second and third gate electrodes 315, 317 may be different.

In example embodiments such as shown in FIGS. 2 and 3, the first gate electrode 313 may be formed at a lowermost level, the third gate electrode 317 may be formed at an uppermost level or a level under the uppermost level, and the second gate electrode 315 may be formed at a plurality of levels between the first and third gate electrodes 313 and 317. However, a person of ordinary skill in the art should understand and appreciate that the arrangement of the gate electrodes may be different than shown in the drawings.

Each gate electrode of the plurality of gate electrodes may include, for example, a gate barrier pattern covering at least some of the gate electrode surfaces, respectively. For example, the first gate electrode 313 may include a first gate conductive pattern 303 and a first gate barrier pattern 293 covering lower and upper surfaces and a portion of a sidewall of the first gate conductive pattern 303, the second gate electrode 315 may include a second gate conductive pattern 305 and a second gate barrier pattern 295 covering lower and upper surfaces and a portion of a sidewall of the second gate conductive pattern 335, and the third gate electrode 317 may include a third gate conductive pattern 307 and a third gate barrier pattern 297 covering lower and upper surfaces and a portion of a sidewall of the third gate conductive pattern 307.

The construction of the first, second and third gate conductive patterns 303, 305 and 307 may include a low resistance metal, e.g., tungsten, titanium, tantalum, platinum etc., and the construction of the first, second and third gate barrier patterns 293, 295 and 297 may include a metal nitride, e.g., titanium nitride, tantalum nitride, etc.

The second blocking layer 280 may cover lower and upper surfaces and a sidewall of each of the first to third gate electrodes 313, 315 and 317, and may be further formed on surfaces of the insulation patterns 115. The construction of the second blocking layer 280 may include a metal oxide, e.g., aluminum oxide, hafnium oxide, lanthanum oxide, lanthanum aluminum oxide, lanthanum hafnium oxide, hafnium aluminum oxide, titanium oxide, tantalum oxide, zirconium oxide, etc.

The second structure may extend through the mold structure in the vertical direction, and may be formed in each of channel holes 140 spaced apart from each other in the horizontal direction. The second structure may include, for example, a semiconductor pattern 150, a first structure, and a capping pattern 220.

In example embodiments of the inventive concept, a plurality of channel holes 140 may be formed in a second direction and a third direction to form a channel hole array. In example embodiments (such as shown in FIG. 6), the channel hole array may include a first channel hole column having a plurality of first channel holes 140a (FIG. 6) arranged in the first direction, and a second channel hole column being spaced apart from the first channel hole column in the second direction and including a plurality of second holes 140b arranged in the first direction. The channel hole columns may be arranged in a pattern. For example, the first channel holes 140a may be disposed at an acute angle with respect to the first direction or the second direction from the second channel holes 140b. Thus, the first and second channel holes 140a, 140b may be arranged in a zigzag layout in the first direction, and a plurality of channel holes 140 may be disposed in a unit area.

The first and second channel hole columns may form a channel hole group, and a plurality of channel hole groups may be repeatedly formed in the second. FIG. 1 shows two channel hole groups linearly symmetrical with respect to the CSL 340 extending in the first direction, however, the inventive concept is not be limited to the arrangement shown in FIG. 1. The number of the channel hole columns included in each channel hole group may not be limited thereto, and the channel hole groups may not be linearly symmetrical.

Each of the channel holes 140, as shown in a plan view in FIGS. 1 and 6, may have a circular shape. However, the inventive concepts are not limited to circular channel holes. For example, each of the channel holes 140 may have other shapes, e.g., an elliptical shape, a rectangular shape, or an irregular shape.

In example embodiments of the inventive concept, each of the channel holes 140 may extend through only one of the plurality of gate electrodes disposed in the second direction at each level. For example, a sidewall of each channel hole 140 may be surrounded by one gate electrode at each level, and may not be exposed.

According to the material of the substrate 100, the semiconductor pattern 150 may include single crystalline silicon or single crystalline germanium, and in some cases, may be doped with impurities. In example embodiments, the semiconductor pattern 150 may have an upper surface arranged between a lower surface and an upper surface of one of the insulation patterns 115 located at a second level from the upper surface of the substrate 100 in the vertical direction.

For example, the semiconductor pattern 150 may horizontally overlap the first gate electrode 313 disposed at a lowermost level among the plurality of gate electrodes, and thus may serve as a channel of a transistor including a GSL, e.g., a ground selection transistor (GST).

The first structure may be formed on the semiconductor pattern 150, and may include, for example, a charge storage structure 190, a channel 200, and a filling pattern 210 sequentially stacked in the horizontal direction from an inner wall of the channel hole 140 (e.g. FIGS. 4 and 5). The charge storage structure 190 may have a cup-like shape of which a bottom is opened, the channel 200 may have a cup-like shape, and the filling pattern 210 may have a pillar shape.

With reference to FIGS. 3, 4, and 5, the charge storage structure 190 may include a first blocking pattern 160, a charge storage pattern 170, and a tunnel insulation pattern 180 sequentially stacked. The first blocking pattern 160 may include, for example, an oxide, e.g., silicon oxide, the charge storage pattern 170 may include, for example, a nitride, e.g., silicon nitride, and the tunnel insulation pattern 180 may include an oxide, e.g., silicon oxide.

The channel 200 may include undoped or doped polysilicon or single crystalline silicon, and the filling pattern 210 may include an oxide, e.g., silicon oxide. In example embodiments of the inventive concept, the channel 200 may horizontally overlap the second and third gate electrodes 315 and 317, and thus may serve as a channel of a transistor including a word line, e.g., a cell transistor, or a channel of a transistor including an SSL, e.g., a string selection transistor (SST).

As the channel holes 140 may form the channel hole group including the first and second channel hole columns and the channel hole groups may form the channel hole array, the channels 200 may also form a channel group including first and second channel columns and the channel groups may form a channel array.

The capping pattern 220 may be formed on the first structure, and may include doped or undoped polysilicon or single crystalline silicon.

The second structure including the semiconductor pattern 150, the first structure and the capping pattern 220 in one channel hole 140 may be divided into a plurality of pieces by the division pattern 240.

In example embodiments of the inventive concept, the division pattern 240 may include a first portion 240a extending in the first direction in each channel hole 140, and a second portion 240b extending in the second direction to cross the first portion in each channel hole 140. Thus, the second structure in one channel hole 140 may be divided into four pieces by the division pattern 240, which is shown in FIGS. 1 and 4.

However, a person of ordinary skill in the art should understand and appreciate that the inventive concept is not be limited to the division of the second structure into four pieces such as shown in FIG. 4.

For example, the second structure may be divided into a plurality of pieces other than four pieces by the division pattern 240. Thus, FIG. 5 shows the second structure is divided into eight pieces in one channel hole 140. Additionally, the second structure may not be divided into a plurality of pieces. In other words, no division pattern may be formed in one or ones of the plurality of channel holes 140, and thus one or ones of the second structures may be divided into a plurality of pieces. In addition, another one or ones of the second structures may not be divided into a plurality of pieces.

Hereinafter, for ease of explanation, the case in which the second structure is divided into four pieces in one channel hole 140 will be discussed herein below.

As the second structure is divided into four pieces, each of the semiconductor pattern. 150, the first blocking pattern 160, the charge storage pattern 170, the tunnel insulation pattern 180, the channel 200, the filling pattern 210, and the capping pattern 220 may be also divided into four pieces. Thus, each of the charge storage structure 190 and the channel 200 may have a portion of the cup-like shape.

Referring to FIG. 6, the division pattern 240 may extend not only through the second structure in the channel hole 140 but may also partially extend through the mold structure including the gate electrodes and the insulation patterns 115 outside of the channel hole 140.

In an example embodiment, the first portions of the division patterns 240 may extend in the first direction so that the first portions of the division patterns 240 in the same channel column may be connected with each other. Even in this case, the division pattern 240 may not extend to opposite ends in the first direction of a portion of the mold structure at an uppermost level, and thus the mold structure may not be divided into two pieces by the division pattern 240.

For example, any division pattern 240 dividing the second structure into a plurality of pieces, or not dividing the mold structure itself are both within the inventive concept.

The division pattern 240 may include, for example, an oxide, e.g., silicon oxide, and thus may be merged with the filling pattern 210.

The CSL 340 may extend through the mold structure in the first direction, and the second spacer 330 may be formed on each of opposite sidewalls of the CSL 340 in the first direction. The CSL 340 may include, for example, a metal, a metal nitride, and/or a metal silicide, and the second spacer 330 may include, for example, an oxide, e.g., silicon oxide. Each of the gate electrodes at each level may be divided into a plurality of pieces in the second direction by the CSL 340 and the second spacer 330.

The impurity region 320 (FIGS. 2 and 3) may be formed at an upper portion of the substrate 100 contacting a bottom of the CSL 340. In example embodiments, the impurity region. 320 may include n-type impurities, e.g., arsenic.

A sidewall of the mold structure may be covered by an insulating interlayer pattern (not shown), and first to fifth insulating interlayers 130, 250, 350, 380 and 400 may be sequentially stacked on the mold structure and the insulating interlayer pattern. The structure of the first to fifth insulating interlayers 130, 250, 350, 380 and 400 may include an oxide, e.g., silicon oxide.

The first and second vias 362 and 364 may extend through the second insulating interlayer 250 to contact upper surfaces of the capping patterns 220. The first wirings 372 may extend through the third insulating interlayer 350 to contact upper surfaces of the first vias 362, respectively, and the second wirings 374 may extend through the third insulating interlayer 350 to contact upper surfaces of the second vias 364. In an example embodiment, each of the first wirings 372 may extend in the second direction, and each of the second wirings 374 may include a first portion extending in the first direction and a second portion extending in the second direction and being connected to the first portion.

In addition, the third and fourth vias 392 and 394 may extend through the fourth insulating interlayer 380 to contact the first and second wirings 372 and 374, respectively. In an example embodiment, each of the third and fourth vias 392 and 394 may overlap the CSL 340, however, the inventive concept is not limited thereto.

According to the inventive concept, the third wirings 410 may extend through the fifth insulating interlayer 400 to contact upper surfaces of the third and fourth vias 392 and 394, respectively. Each of the third wirings 410 may extend in the second direction to contact an upper surface of at least one of the third and fourth vias 392 and 394. Each of the third wirings 410 may serve as a bit line of each of the first and second vertical memory devices.

As illustrated above, in each of the first and second vertical memory devices, rather than one channel 200 being formed in one channel hole 140, according to the inventive concept the channel 200 may be divided into a plurality of pieces (e.g. subchannels) by the division pattern 240 so that a plurality of channels 200 may be formed in one channel hole 140. Thus, the vertical memory device including the channel 200 may have a high integration degree. The division pattern 240 may extend into the hole in the gate electrode to form a plurality of channels (e.g. subchannels) in the gate electrode.

FIGS. 7 to 26 are plan views and cross-sectional views illustrating various stages of a method of manufacturing a vertical memory device in accordance with example embodiments. More particularly, FIGS. 7, 9, 11, 14, 16, 19, 23 and 25 are plan views, and FIGS. 8, 10, 12-13, 15, 17-18, 20-22, 24 and 26 are cross-sectional views. In addition, FIGS. 8, 10, 12-13, 15 and 17 are cross-sectional views taken along line A-A' of corresponding plan views, respectively. In addition, FIGS. 18, 20-22, 24 and 26 are cross-sectional views taken along line B-B' of corresponding plan views, respectively.

Figure 8:
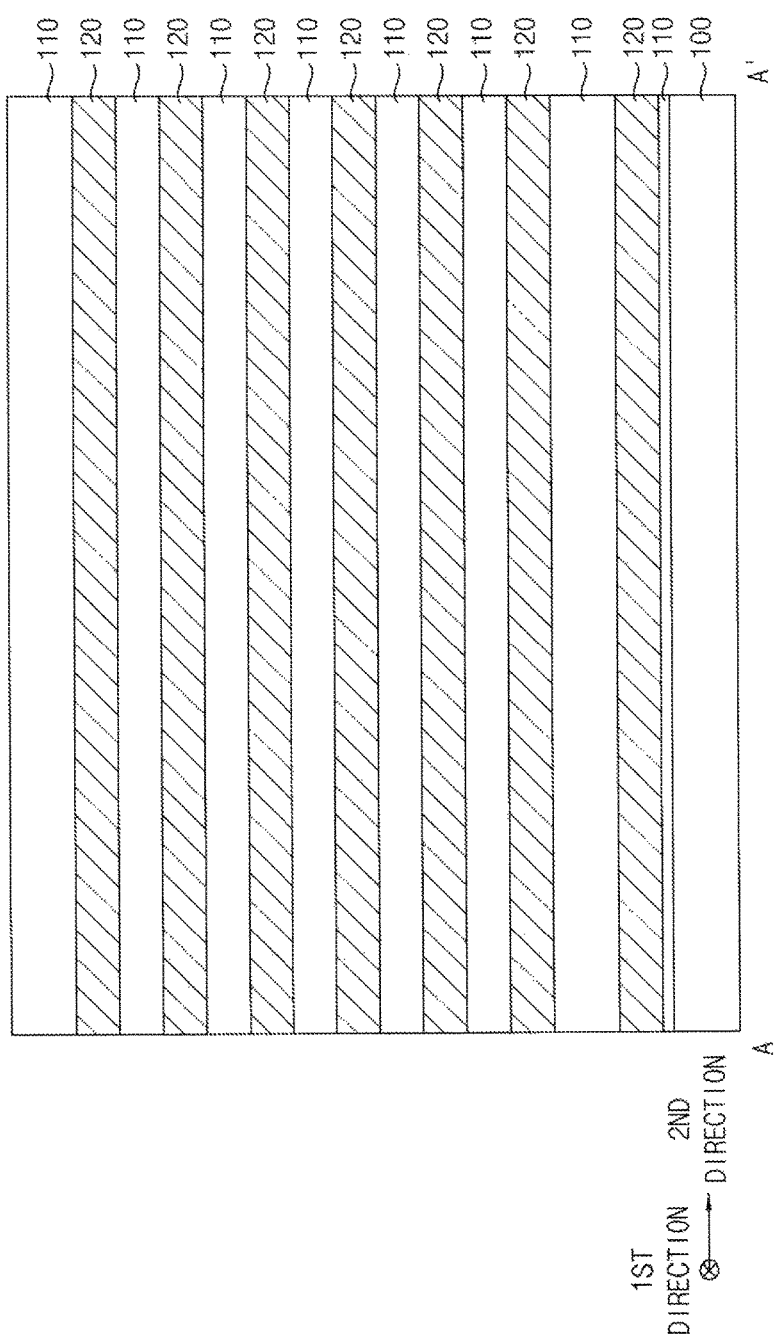
FIG. 8 is a cross-sectional view of insulation layers and sacrificial layers.

Referring now to FIGS. 7 and 8, an insulation layer 110 and a sacrificial layer 120 may be alternately and repeatedly formed on the substrate 100. Thus, a plurality of insulation layers 110 and a plurality of sacrificial layers 120 may be alternately stacked on each other in the vertical direction. FIG. 8 shows for illustrative purposes, eight insulation layers 110 and seven sacrificial layers 120 alternately stacked. However, a person of ordinary skill in the art should understand and appreciate that the inventive concepts is not limited to any particular number regarding the arrangement of the insulation layers 110 and the sacrificial layers 120.

The insulation layers 110 and the sacrificial layers 120 may be formed by a chemical vapor deposition (CVD) process, a plasma enhanced chemical vapor deposition (PE-CVD) process, an atomic layer deposition (ALD) process, etc.

In addition, the insulation layers 110 may be formed of a silicon oxide, e.g., plasma enhanced tetraethylorthosilicate (PE-TEOS), high density plasma (HDP) oxide, plasma enhanced oxide (PEOX), etc. The sacrificial layers 120 may be formed of a material having an etching selectivity with respect to the insulation layers 110, e.g., silicon nitride.

Figure 9:
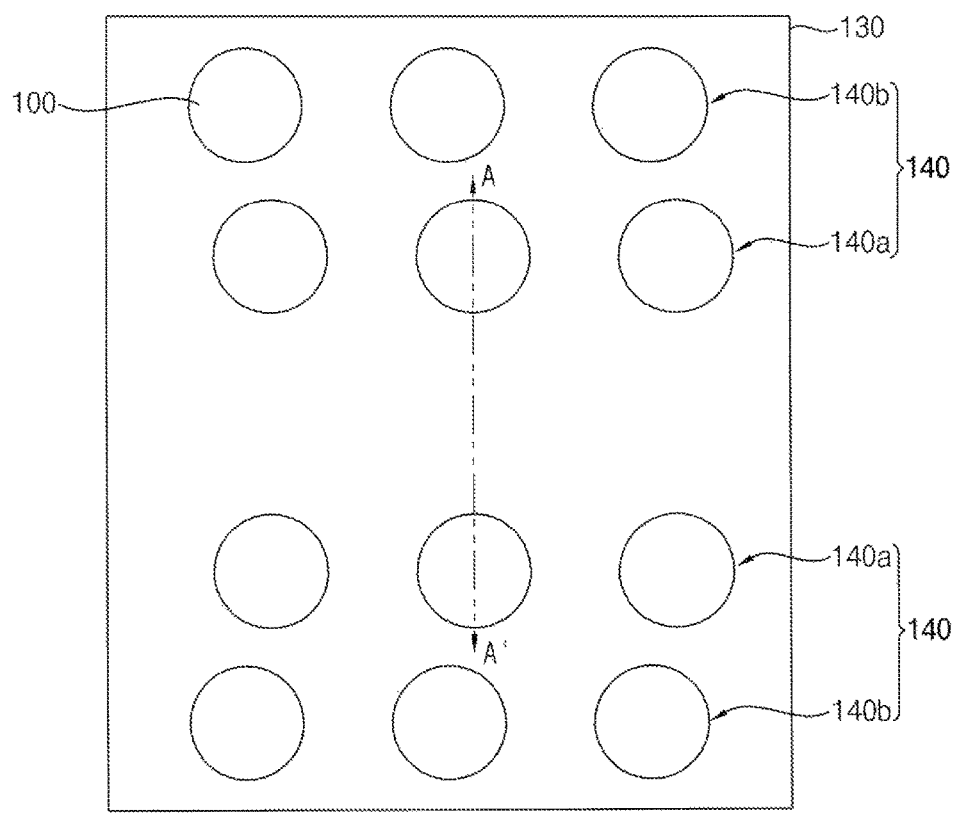
FIG. 9 shows two channel hole groups linearly symmetrical with respect to an imaginary line extending in the first direction.
Figure 10:
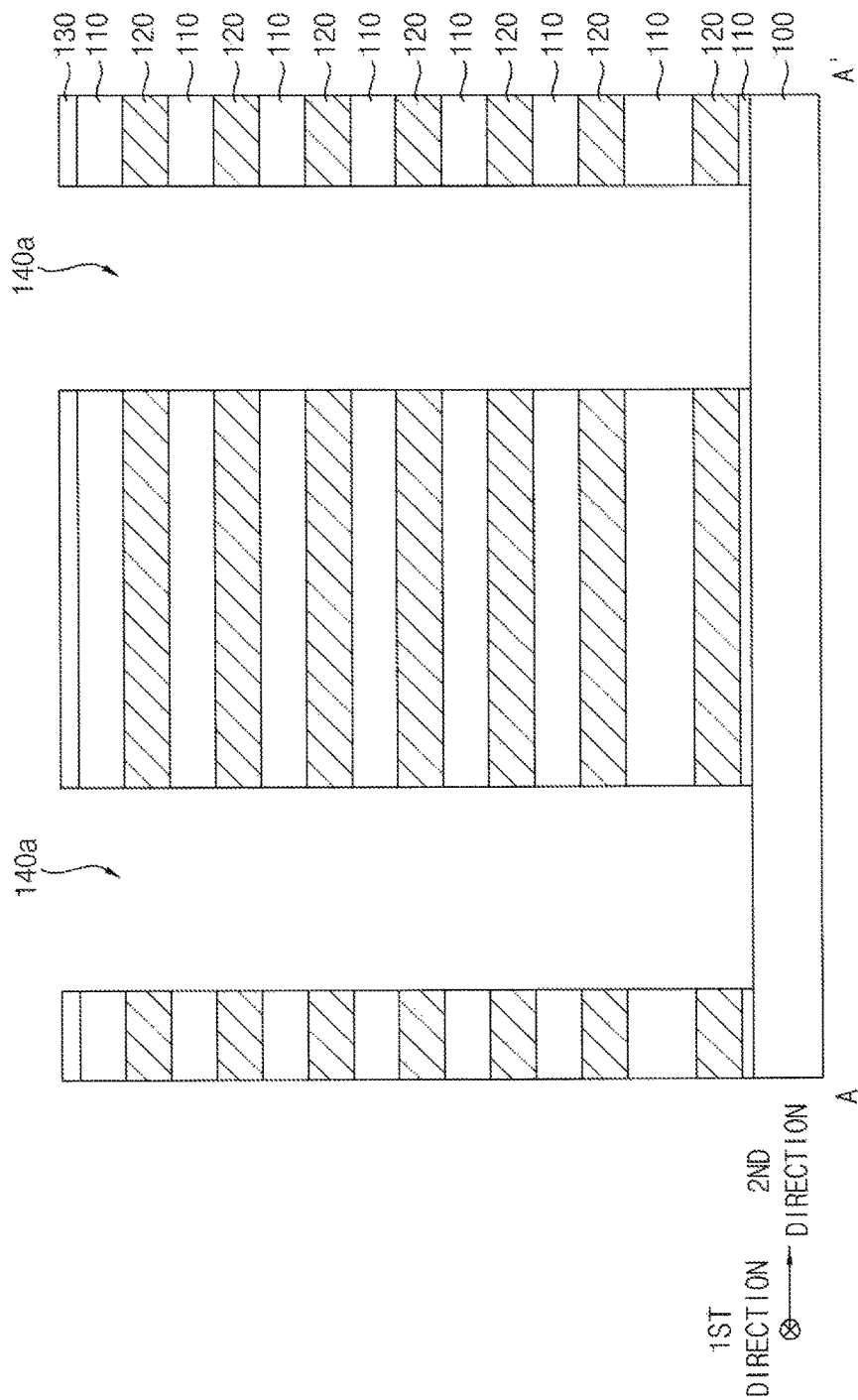
FIG. 10 shows a cross-sectional view of first channel columns.

Referring to FIGS. 9 and 10, a photoresist pattern (not shown) may be formed on an uppermost one of the insulation layers 110 to cover at least partially the uppermost one of the insulation layers 110. In addition, the uppermost one of the insulation layers 110 and an uppermost one of the sacrificial layers 120 may be etched using the photoresist pattern as an etching mask. Thus, a portion of one of the insulation layers 110 under the uppermost one of the sacrificial layers 120 may be exposed. After reducing an area of the photoresist pattern, the uppermost one of the insulation layers 110, the uppermost one of the sacrificial layers 120, the exposed one of the insulation layers 110, and one of the sacrificial layers 120 under the exposed one of the insulation layers 110 may be etched using the reduced photoresist pattern as an etching mask. The above process, e.g., a trimming process, may be repeatedly performed to form a staircase structure including a plurality of steps each having the sacrificial layer 120 and the insulation layer 110 sequentially stacked.

In example embodiments of the inventive concept, the steps included in the staircase structure may have areas decreasing by a constant ratio from a bottom toward a top thereof.

An insulating interlayer pattern (not shown) covering a sidewall of the staircase structure may be formed on the substrate 100, and a first insulating interlayer 130 may be formed on an upper surface of the staircase structure and an upper surface of the insulating interlayer pattern. The first insulating interlayer 130 may be formed of an oxide, e.g., silicon oxide.

In addition, a first mask (not shown) may be formed on the first insulating interlayer 130. The first insulating interlayer 130, the insulation layers 110, and the sacrificial layers 120 may be etched using the first mask as an etching mask to form a channel hole 140 therethrough exposing an upper surface of the substrate 100.

In example embodiments of the inventive concept, a plurality of channel holes 140 may be formed in the second and third directions to form a channel hole array. As shown, for example, in FIG. 9, in example embodiments, the channel hole array may include a first channel hole column including a plurality of first channel holes 140a arranged in the first direction, and a second channel hole column being spaced apart from the first channel hole column in the second direction and including a plurality of second channel holes 140b arranged in the first direction. A first plurality of channel holes 140a may be disposed at an acute angle with respect to the first direction or the second direction from the second channel holes 140b, such that the first plurality of channel holes 140a are not in strict alignment with a second plurality of holes 140b. Thus, the first and second channel holes 140a, 140b may be arranged in a zigzag layout in the first direction, and a plurality of channel holes 140 may be disposed in a unit area.

The first and second channel hole columns may form a channel hole group, and a plurality of channel hole groups may be repeatedly firmed in the second direction. Although FIG. 8 shows two channel hole groups linearly symmetrical with respect to an imaginary line extending in the first direction, the inventive concept is not limited thereto. The number of the channel hole columns included in each channel hole group may not be limited thereto, and the channel hole groups may not be linearly symmetrical.

Each of the channel holes 140 may have a circular shape when shown in a plan view, however, the inventive concepts may not be limited thereto. Thus, each of the channel holes 140 may have other shapes, e.g., an elliptical shape or a substantially rectangular shape, or any polygonal shape.

Figure 12:
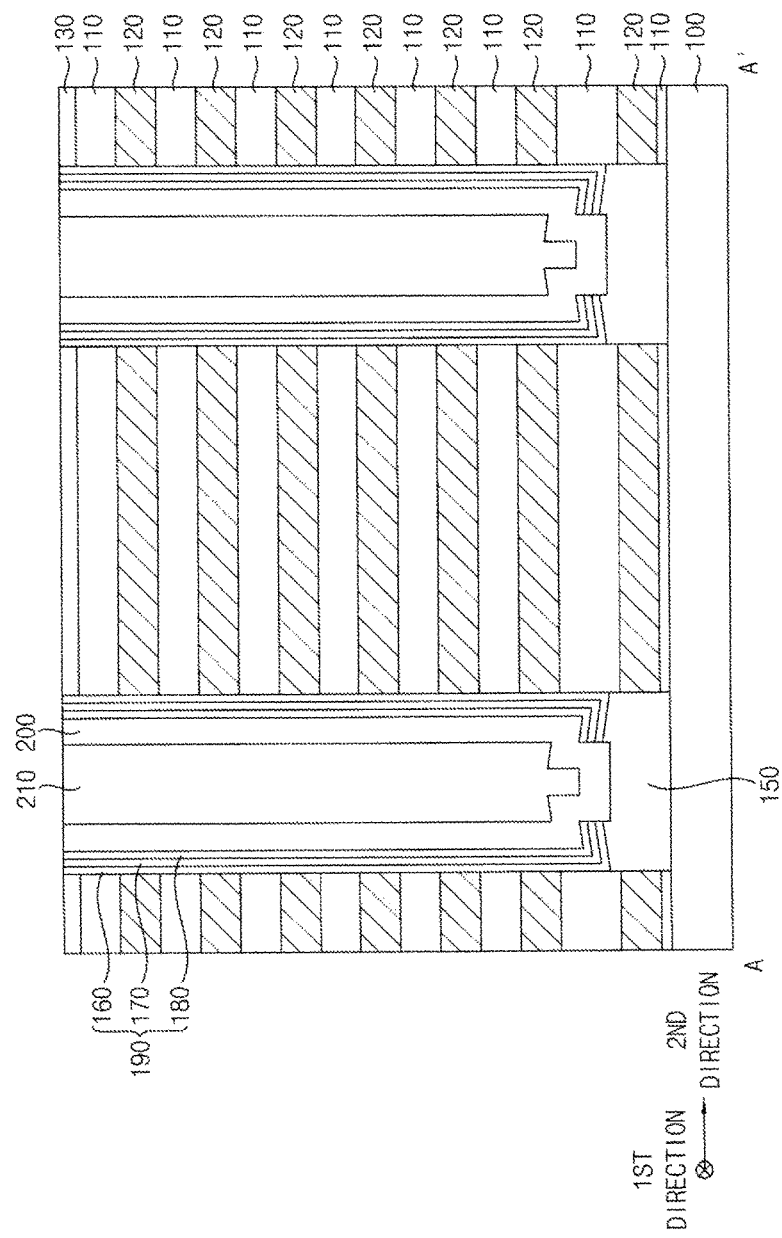

FIGS. 11 and 12 show that after removal of the first mask, a semiconductor pattern. 150 may be formed to fill a lower portion of the channel hole 140.

More particularly, a selective epitaxial growth (SEG) may be performed using a portion of the substrate 100 exposed by the channel hole 140 as a seed to form the semiconductor pattern 150 partially filling the channel hole 140. Thus, the semiconductor pattern 150 may include single crystalline silicon, single crystalline germanium, etc., depending on the material of the substrate 100. In some cases, impurities may be doped into the semiconductor pattern 150.

Alternatively, the semiconductor pattern 150 may be formed by providing an amorphous semiconductor layer that fills the channel hole 140, and then performing a laser epitaxial growth (LEG) process or a solid phase epitaxy (SPE) process.

In example embodiments of the inventive concept, an upper surface of the semiconductor pattern 150 may be formed between a lower surface and an upper surface of one of the insulation layers 110 located at a second level from the upper surface of the substrate 100 in the vertical direction.

In addition, a first blocking layer 160 (pattern), a charge storage layer 170 (pattern), a tunnel insulation layer 180 (pattern), and a first spacer layer may be sequentially formed on sidewalls of channel holes 140, upper surfaces of the semiconductor patterns 150, and an upper surface of the first insulating interlayer 130, the first spacer layer may be anisotropically etched to form a first spacer (not shown) on the sidewalls of the channel holes 140, and the tunnel insulation layer, the charge storage layer, and the first blocking layer may be etched using the first spacer as an etching mask to form a tunnel insulation pattern 180, a charge storage pattern 170, and a first blocking pattern 160, respectively, on the upper surface of each of the semiconductor pattern 150 and the sidewall of each of the channel holes 140, which may have a cup-like shape of which a bottom is opened. During the etching process, an upper portion of the semiconductor pattern 150 may be partially removed. The tunnel insulation pattern 180, the charge storage pattern 170, and the first blocking pattern 160 may form a charge storage structure 190.

The first blocking layer may be formed of an oxide, e.g., silicon oxide, and the charge storage layer may be formed of a nitride, e.g., silicon nitride, the tunnel insulation layer may be formed of an oxide, e.g., silicon oxide, and the first spacer layer may be formed of a nitride, e.g., silicon nitride.

After removing the first spacer, a channel layer may be formed on the exposed semiconductor pattern 150, the tunnel insulation pattern 180, and the charge storage pattern 170, and a filling layer may be formed on the channel layer to sufficiently fill remaining portions of the channel holes 140.

In addition, the channel layer may be firmed of doped or undoped polysilicon or amorphous silicon. When the channel layer includes amorphous silicon, an LEG process or an SPE process may be further performed to convert amorphous silicon into crystalline silicon. The filling layer may be formed of an oxide, e.g., silicon oxide.

The filling layer and the channel layer may be planarized until an upper surface of the first insulating interlayer 130 may be exposed to form a filling pattern 210 filling the remaining portion of each of the channel holes 140, and the channel layer may be transformed into a channel 200.

Thus, according to an embodiment of the inventive concept, the charge storage structure 190, the channel 200, and the filling pattern 210 may be sequentially stacked on the semiconductor pattern 150 in each of the channel holes 140.

The charge storage structure 190 may have a cup-like shape of which a bottom is opened, the channel 200 may have a cup-like shape, and the filling pattern 210 may have a pillar shape.

As the channel holes 140 may form the channel hole column, the channel hole group, and the channel hole array, the channel 200 may also form a channel column, a channel group, and a channel array.

Figure 13:
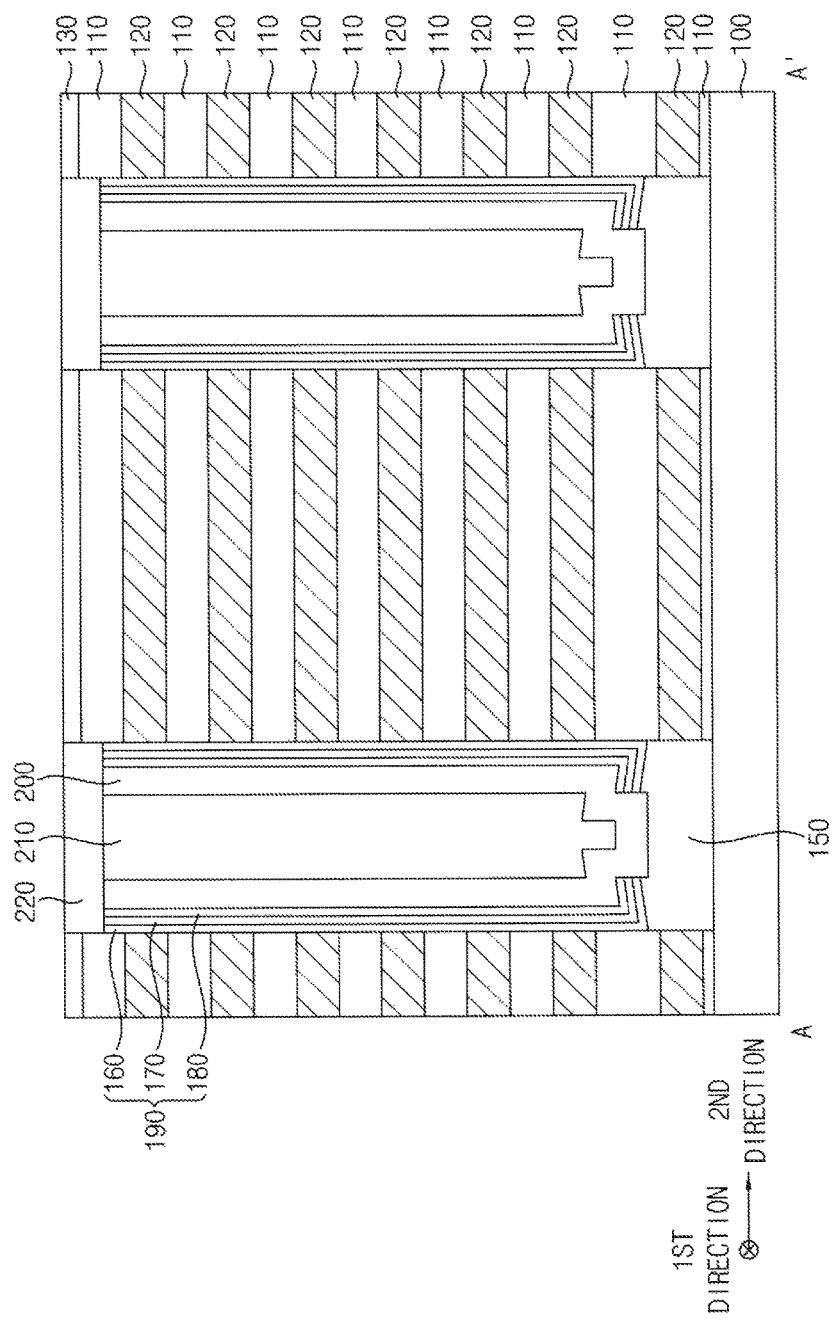
FIG. 13 shows an upper portion of a first structure including the filling pattern and the channel.

Referring now to FIG. 13, an upper portion of a first structure including the filling pattern 210, the channel 200, and the charge storage structure 190 may be removed to form a trench (not shown), and a capping pattern 220 may be formed to fill the trench.

More particularly, after removing the upper portion of the first structure by an etch back process to form the trench, a capping layer filling the trench may be formed on the first structure and the first insulating interlayer 130, and an upper portion of the capping layer may be planarized until the upper surface of the first insulating interlayer 130 may be exposed to form the capping pattern 220. In some example embodiments of the inventive concept, the capping layer may be formed of doped or undoped polysilicon or amorphous silicon. When the capping layer is formed to include amorphous silicon, a crystallization process may be further performed thereon.

The semiconductor pattern 150, the first structure, and the capping pattern 220 may be sequentially stacked in each channel hole 140 and may define a second structure.

Figure 14:
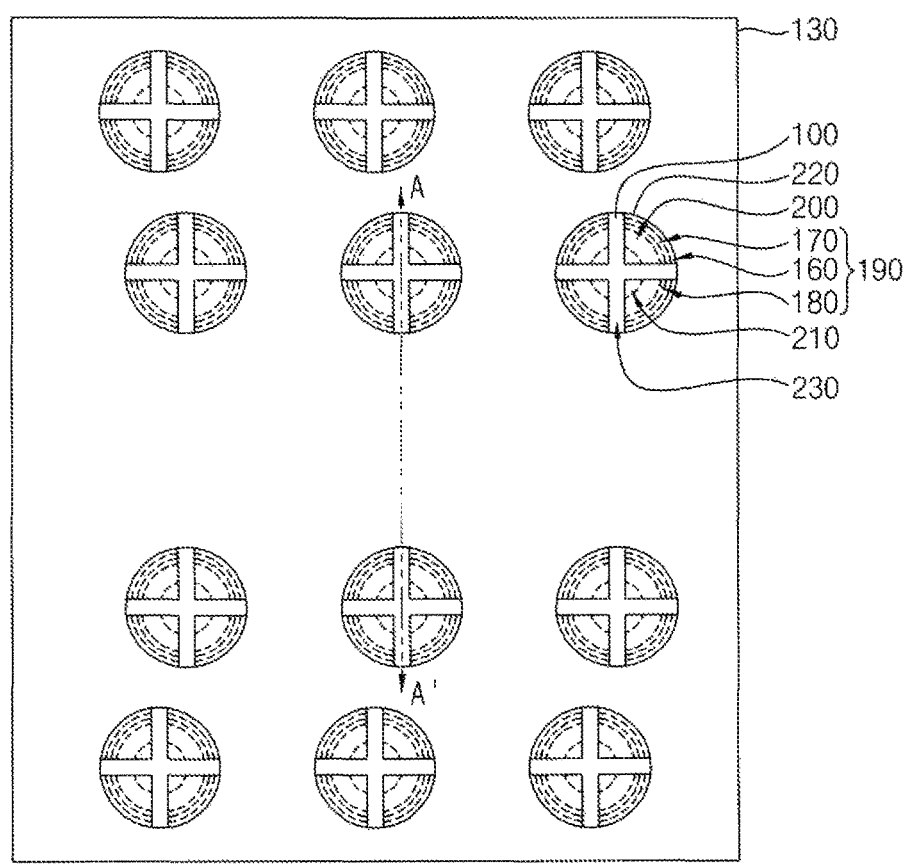
FIGS. 14 and 15 show where the underlying second structures are etched using an etching mask to form a first opening.
Figure 15:
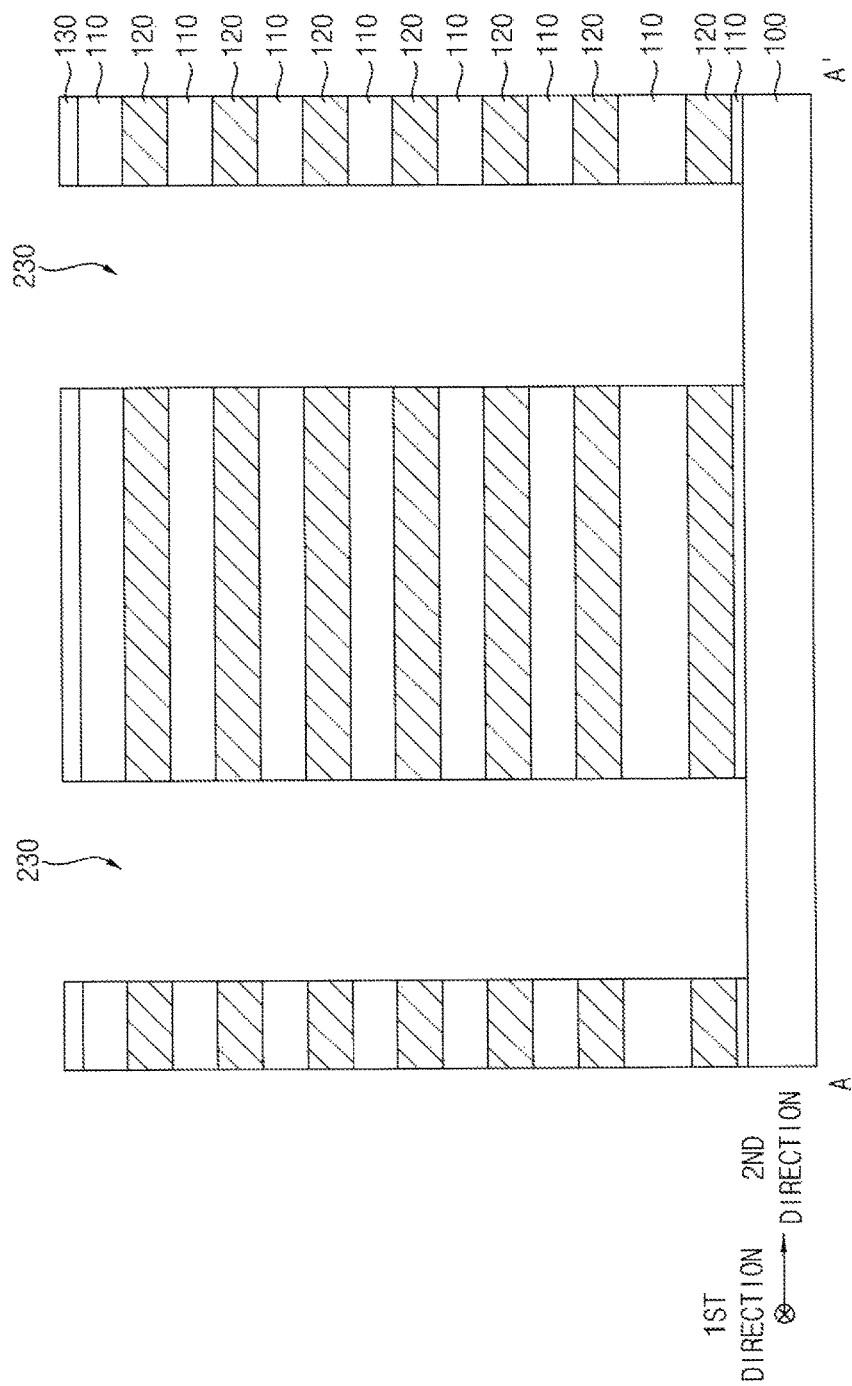

Referring to FIGS. 14 and 15, a second mask (not shown) may be formed on the first insulating interlayer 130, and the underlying second structures may be etched using the second mask as an etching mask to form a first opening 230 partially exposing an upper surface of the substrate 100.

In some example embodiments, the first opening 230 may have a first portion extending in the first direction and a second portion extending in the second direction and crossing the first portion. Thus, the second structure may be divided into four pieces by the first opening 230. However, the inventive concept is not limited thereto, and the second structure may be divided into a plurality of pieces other than four pieces, a desired. Hereinafter, for the convenience of explanation, only the second structure divided into four pieces will be illustrated.

In a case where the second structure is divided into four pieces, each of the semiconductor pattern 150, the first blocking pattern 160, the charge storage pattern 170, the tunnel insulation pattern 180, the channel 200, the filling pattern 210, and the capping pattern 220 may be also divided into four pieces. Although in the inventive concept there may not be a one-to-one correspondence between divisions of the second structure and the semiconductor pattern 150, first blocking pattern 160, charge storage pattern 170, tunnel insulation pattern 180, channel 200, and filling pattern 210, some embodiments discussed herein do have a one-to-one correspondence.

As illustrated with reference to FIG. 6, the second mask may expose more than the second structure, for example, the second mask may also expose a portion of an upper surface of the first insulating interlayer 130, and thus the first opening 230 may be formed by etching the second structure and the first insulating interlayer 130, the insulation layers 110, and the sacrificial layers 120.

In an example embodiment, the first portions of the first openings 230 may extend in the first direction so that the first portions of ones of the first openings 230 dividing ones of the channels 200 included in the same channel column may be connected with each other. In this case, the first opening 230 may not extend to opposite ends in the first direction of a portion of the mold structure at an uppermost level, and thus the mold structure may not be divided into two pieces by the first opening 230.

For example any first opening 230, which divides the second structure into a plurality of pieces but does not divide the mold structure itself, may be included in the scope of the inventive concept.

Figure 16:
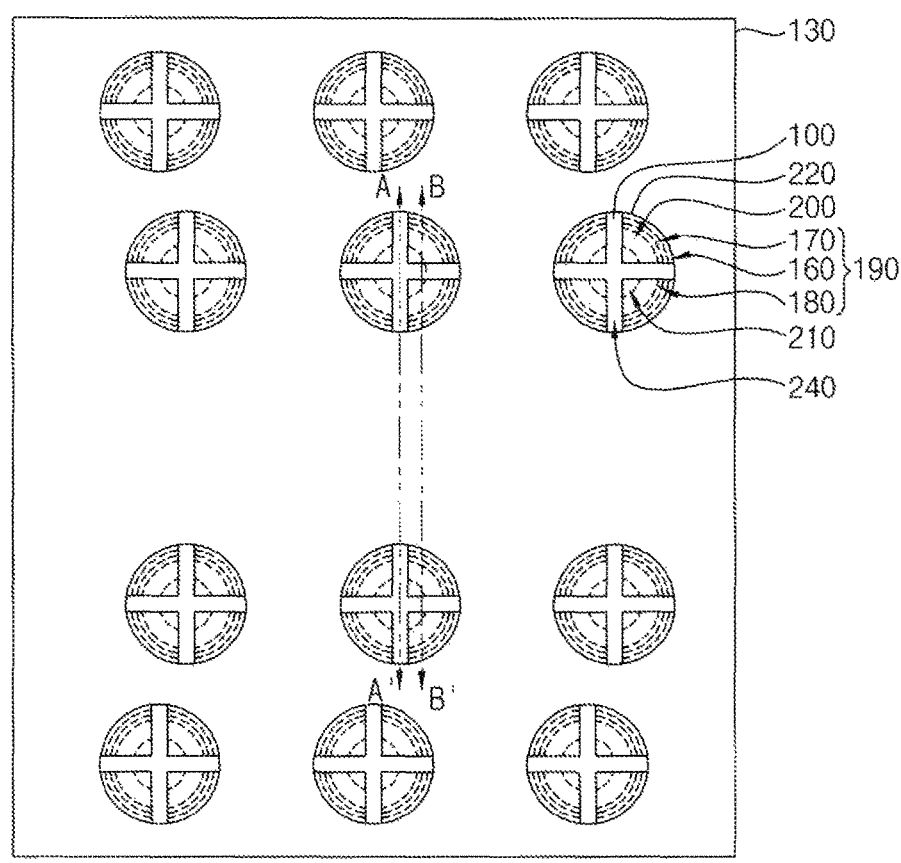
FIGS. 16, 17 and 18 are different views of a division pattern being formed to fill a first opening 230.
Figure 17:
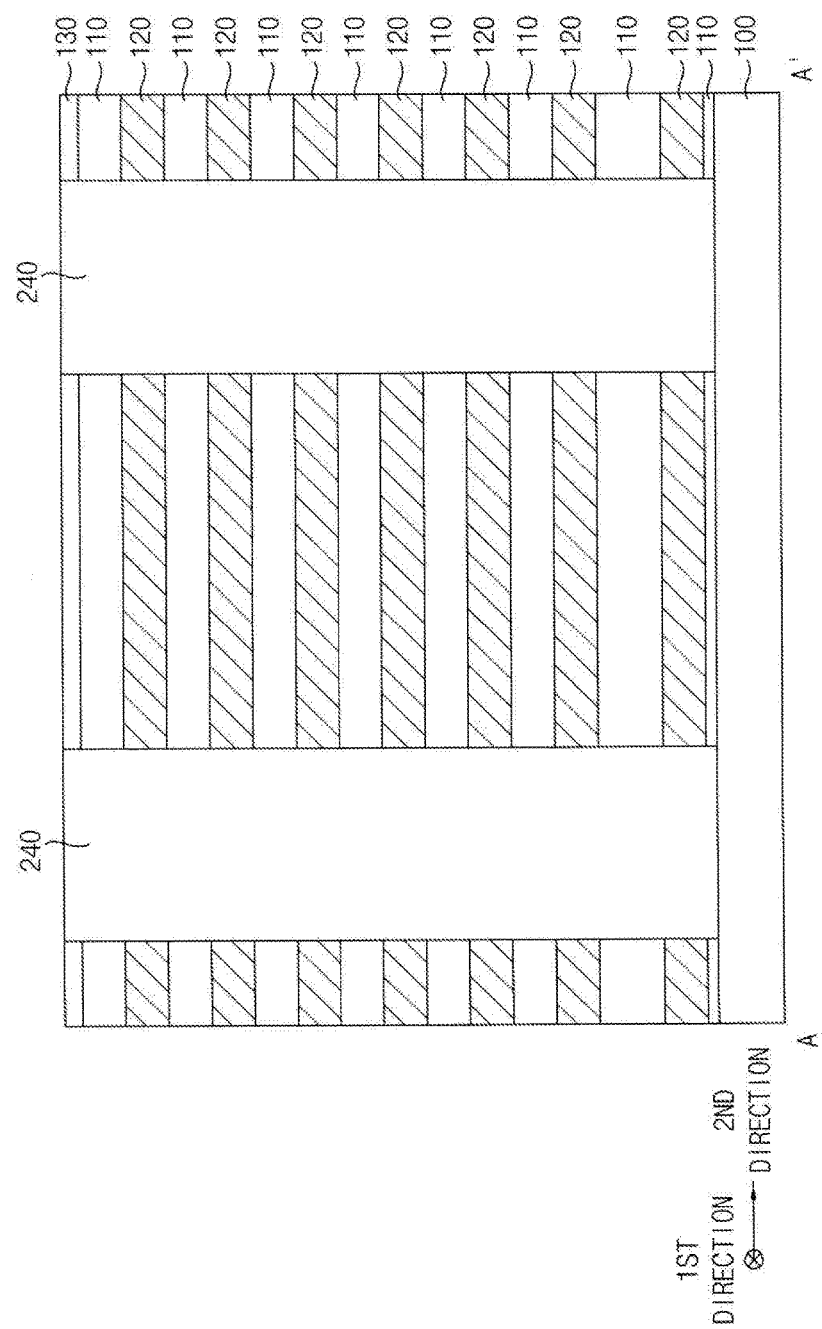
Figure 18:
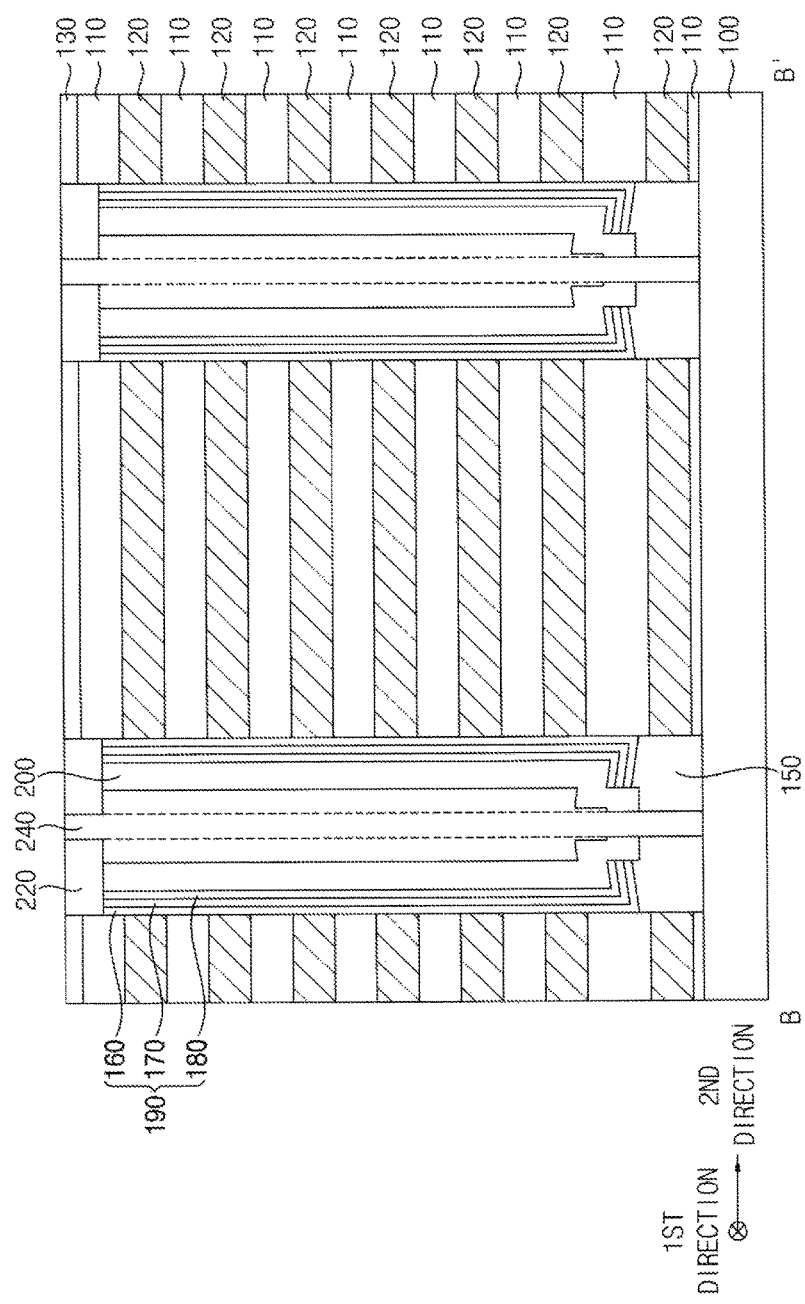

Referring to FIGS. 16 to 18, a division pattern 240 may be formed to fill the first opening 230.

In example embodiments, the division pattern 240 may be formed by forming a division layer on the exposed upper surface of the substrate 100 and the first insulating interlayer 130 to fill the first opening 230, and planarizing the division layer until the upper surface of the first insulating interlayer 130 may be exposed. The planarization process may include, for example, a chemical mechanical polishing (CMP) process and/or an etch back process. The division layer may be formed of an oxide, e.g., silicon oxide, and may be merged with the filling pattern 210.

Figure 19:
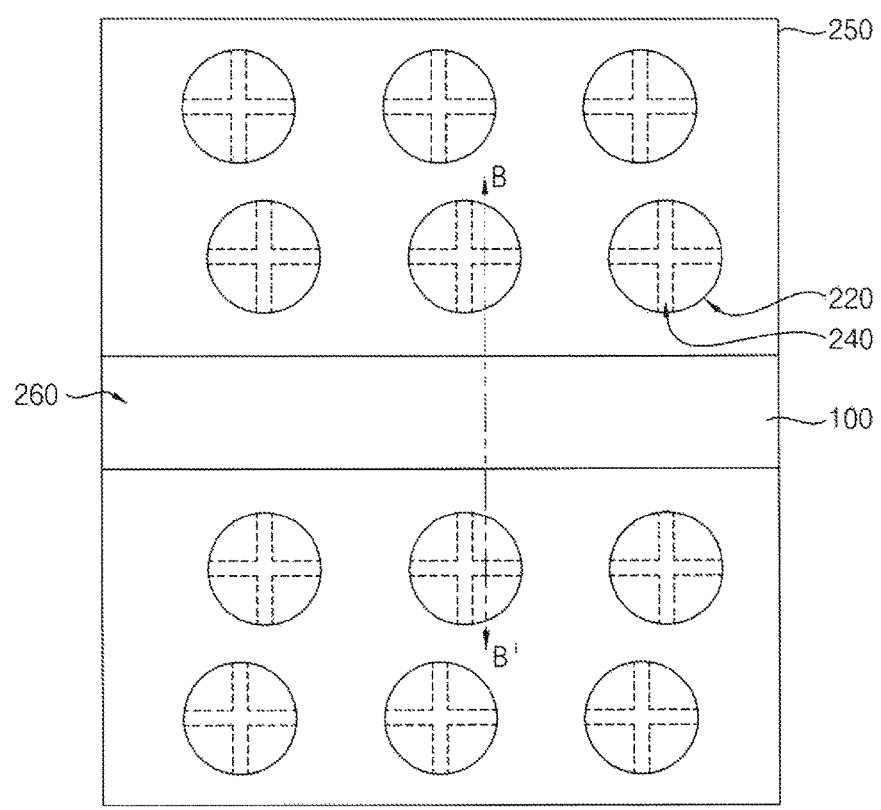
FIGS. 19 and 20 are a respective plan and front view in cross-section showing the insulating interlayer 250 formed on the first insulating interlayer 130, the capping pattern 220, and the division pattern 240.
Figure 20:
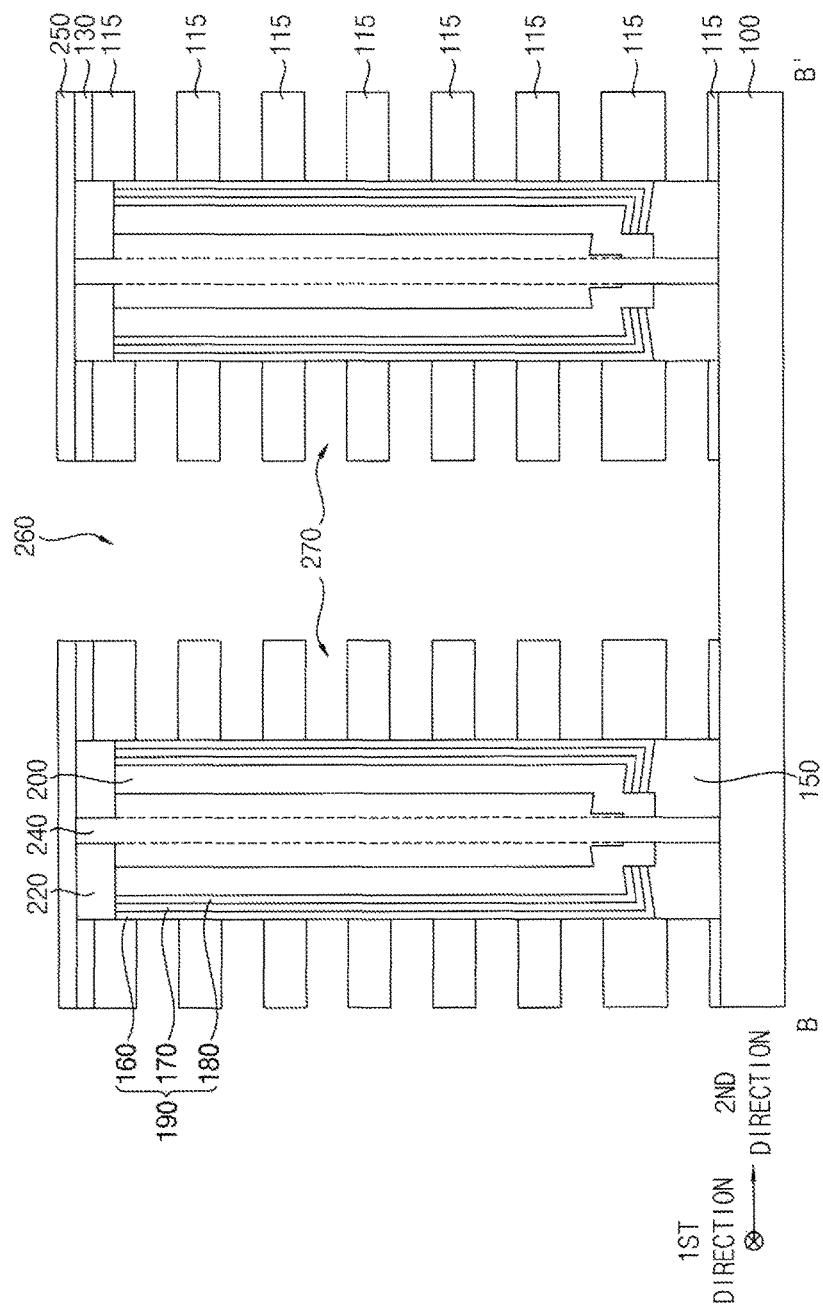

Referring to FIGS. 19 and 20, a second insulating interlayer 250 may be formed on the first insulating interlayer 130, the capping pattern 220, and the division pattern 240. A third mask (not shown) may be formed on the second insulating interlayer 250, and a second opening 260 may be formed through the underlying first and second insulating interlayers 130 and 250, the insulation layers 110, and the sacrificial layers 120 to expose an upper surface of the substrate 100. The second insulating interlayer 250 may be formed of an oxide, e.g., silicon oxide.

In some example embodiments of the inventive concept, the second opening 260 may extend in the first direction between the channel groups, and a plurality of second openings 260 may be formed in the second direction. For example, one channel group including two channel columns may be formed between neighboring ones of the second openings 260. However, the inventive concepts may not be limited thereto, and according to the number of the channel columns in each channel group, the number of the channel columns between neighboring ones of the second openings 260 may be changed.

After removing the third mask, the sacrificial layer 120 exposed by the second opening 260 may be removed to form a gap 270 between the insulation layers 110 at respective levels, and a portion of an outer sidewall of the first blocking pattern 160 and a portion of a sidewall of the semiconductor pattern 150 may be exposed by the gap 270. The sacrificial patterns exposed by the gap 270 may be removed by a wet etching process using an etchant including, e.g., phosphoric acid or sulfuric acid.

As the second opening 260 extending in the first direction is formed, each of the insulation layers 110 at each level may be transformed into a plurality of insulation patterns 115 in the second direction each of which may extend in the first direction.

Figure 21:
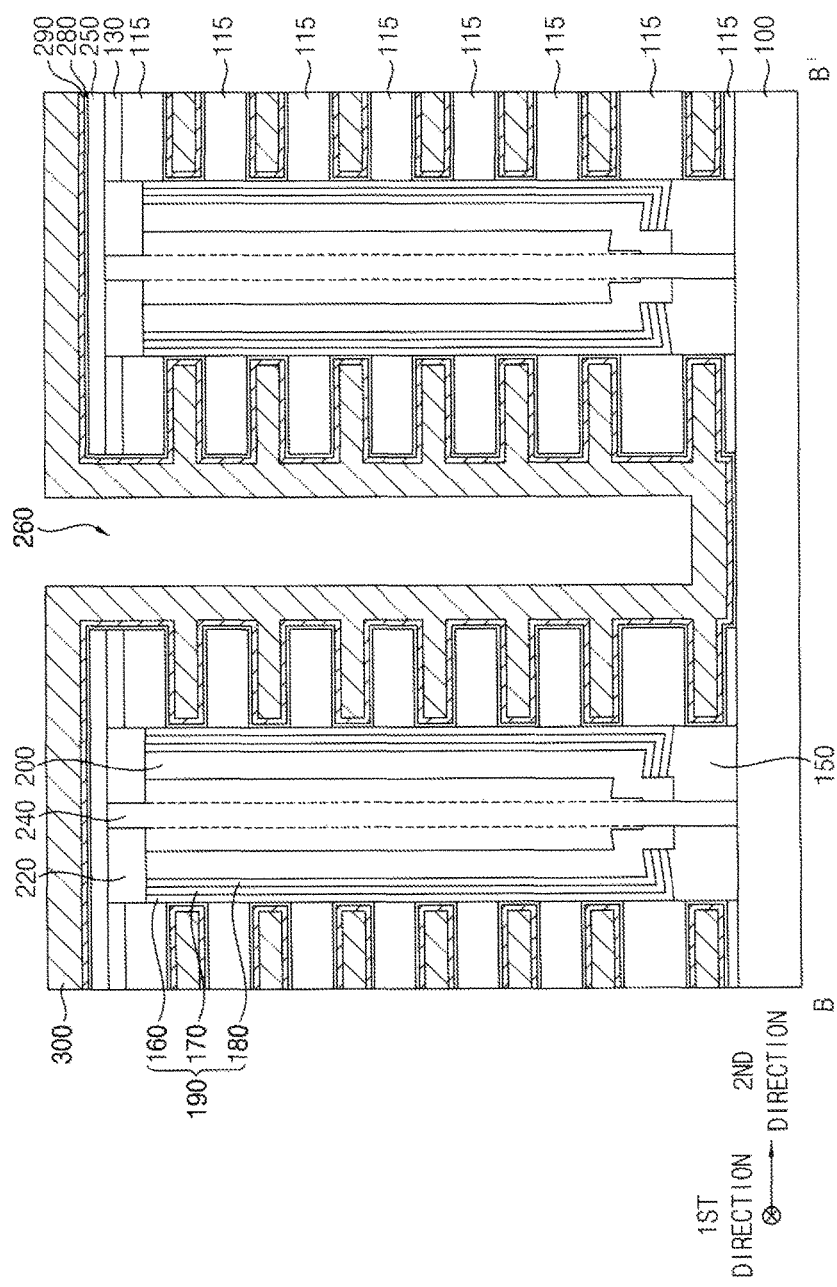
FIG. 21 is a cross-sectional view of a second blocking layer 280 may be formed on the exposed portion of the outer sidewall of the first blocking pattern 160.

Referring now to FIG. 21, after a second blocking layer 280 may be formed on the exposed portion of the outer sidewall of the first blocking pattern 160, the exposed portion of the sidewall of the semiconductor pattern 150, an inner wall of the gap 270, surfaces of the insulation patterns 115, the exposed upper surface of the substrate 100, and an upper surface of the second insulating interlayer 250, a gate barrier layer 290 may be formed on the second blocking layer 280, and a gate conductive layer 300 may be formed on the gate barrier layer 290 to sufficiently fill a remaining portion of the gap 270 between the insulation layers 110.

More particularly, the second blocking layer 280 may be formed of a metal oxide, e.g., aluminum oxide, hafnium oxide, lanthanum oxide, lanthanum aluminum oxide, lanthanum hafnium oxide, hafnium aluminum oxide, titanium oxide, tantalum oxide and/or zirconium oxide. The gate conductive layer 300 may be formed of a metal having a low resistance, e.g., tungsten, titanium, tantalum, platinum, etc., and the gate barrier layer 290 may be formed of a metal nitride, e.g., titanium nitride, tantalum nitride, etc. Alternatively, the gate barrier layer 290 may be formed to have a first layer including a metal, and a second layer including a metal nitride layer. The first layer and the second layer of the gate barrier may be sequentially stacked.

Figure 22:
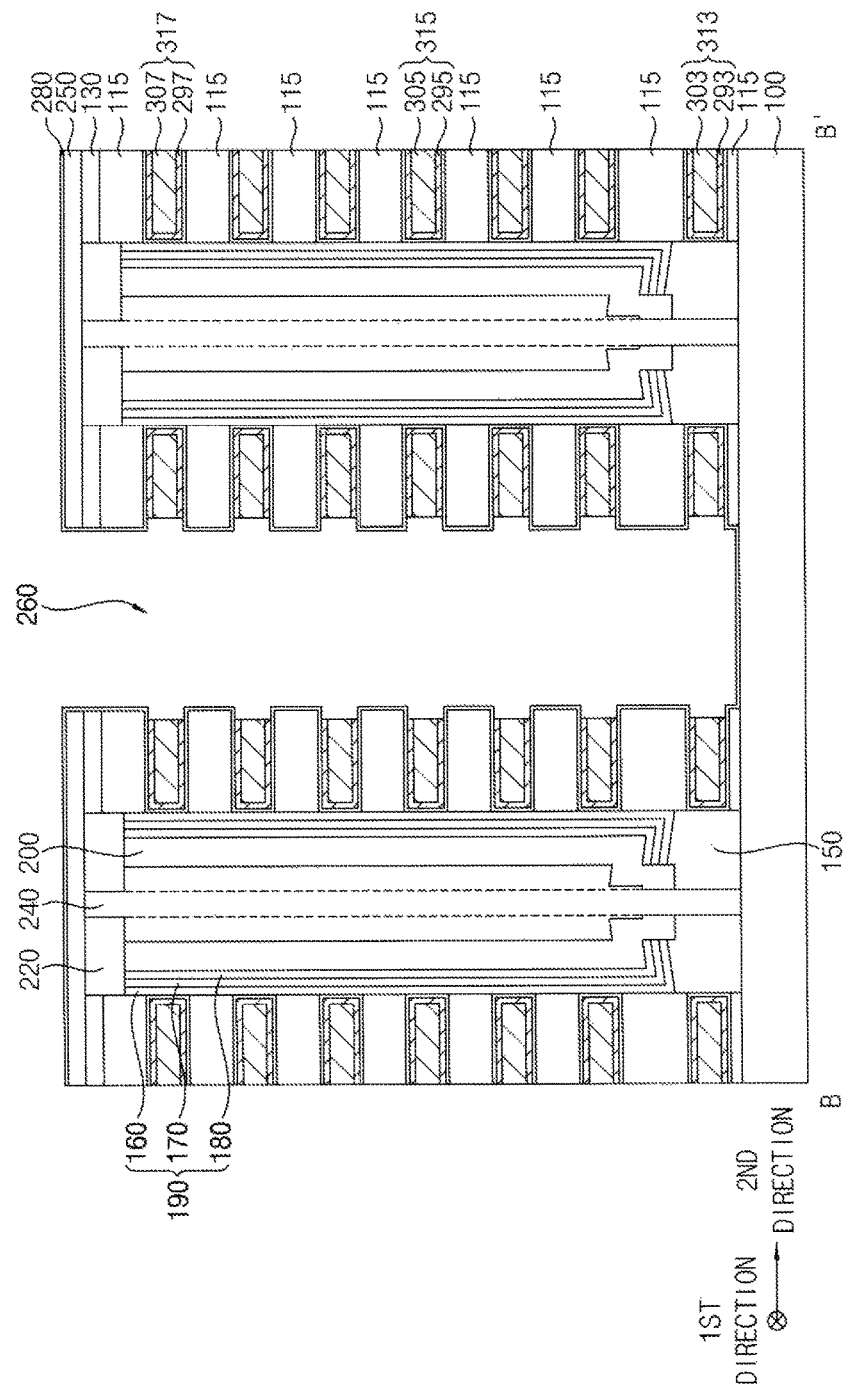
FIG. 22 is a cross-sectional view showing the gate conductive layer 300 and the gate barrier layer 290 partially removed to form a gate conductive pattern and a gate barrier pattern, respectively.

Referring now to FIG. 22, the gate conductive layer 300 and the gate barrier layer 290 may be partially removed to form a gate conductive pattern and a gate barrier pattern, respectively, in the gap 270, which may form a gate electrode. In example embodiments, the gate conductive layer 300 and the gate barrier layer 290 may be partially removed by a wet etching process.

In example embodiments, the gate electrode may be formed to extend in the first direction, and a plurality of gate electrodes may be formed in the second direction. The first direction and second direction, as discussed above, are substantially horizontal directions that cross, and are substantially parallel to a surface of the substrate 100. For example, a plurality of gate electrodes each extending in the first direction may be spaced apart from each other in the second direction by the second opening 260.

Each of opposite ends of the gate electrode in the first direction may be referred to as a pad. For example, a plurality of gate electrodes may be spaced apart from each other in the vertical direction, and each of the gate electrodes may extend in the first direction. Lengths of the gate electrodes in the first direction may decrease from a lowermost level toward an uppermost level, and thus the whole structure of the gate electrodes may have a staircase shape. Likewise, the gate electrodes and the insulation patterns 115 alternately and repeatedly stacked in the vertical direction having the staircase shape may define a mold structure.

The gate electrode may include first, second and third gate electrodes 313, 315 and 317 sequentially stacked in the vertical direction. The first gate electrode 313 may serve as a ground selection line GSL, the second gate electrode 315 may serve as a word line, and the third gate electrode 317 may serve as a string selection line SSL. Each of the first, second and third gate electrodes 313, 315 and 317 may be formed at a single level or a plurality of levels. One or a plurality of dummy word lines may be formed between the first and second gate electrodes 313 and 315 and/or between the second and third gate electrodes 315 and 317.

In example embodiments, the first gate electrode 313 may be formed at a lowermost level, the third gate electrode 317 may be formed at an uppermost level and a level under the uppermost level, and the second gate electrode 315 may be formed at levels between the first and third gate electrodes 313 and 317. Thus, the first gate electrode 313 may be formed adjacent the semiconductor pattern 150, and each of the second and third gate electrodes 315 and 317 may be formed adjacent the channel 200.

The first gate electrode 313 may include a first gate conductive pattern 303 and a first gate barrier pattern 293 covering lower and upper surfaces and a portion of a sidewall of the first gate conductive pattern 303. In addition, the second gate electrode 315 may include a second gate conductive pattern 305 and a second gate barrier pattern 295 covering lower and upper surfaces and a portion of a sidewall of the second gate conductive pattern 305, and the third gate electrode 317 may include a third gate conductive pattern 307 and a third gate barrier pattern 297 covering lower and upper surfaces and a portion of a sidewall of the third gate conductive pattern 307.

It can be seen FIG. 22 that the second blocking layer 280 is not removed but extends in the vertical direction, however, the inventive concepts may not be limited thereto. For example, the second blocking layer 280 may be partially removed, and a second blocking pattern only on the inner walls of the gaps 270 may be formed.

Figure 23:
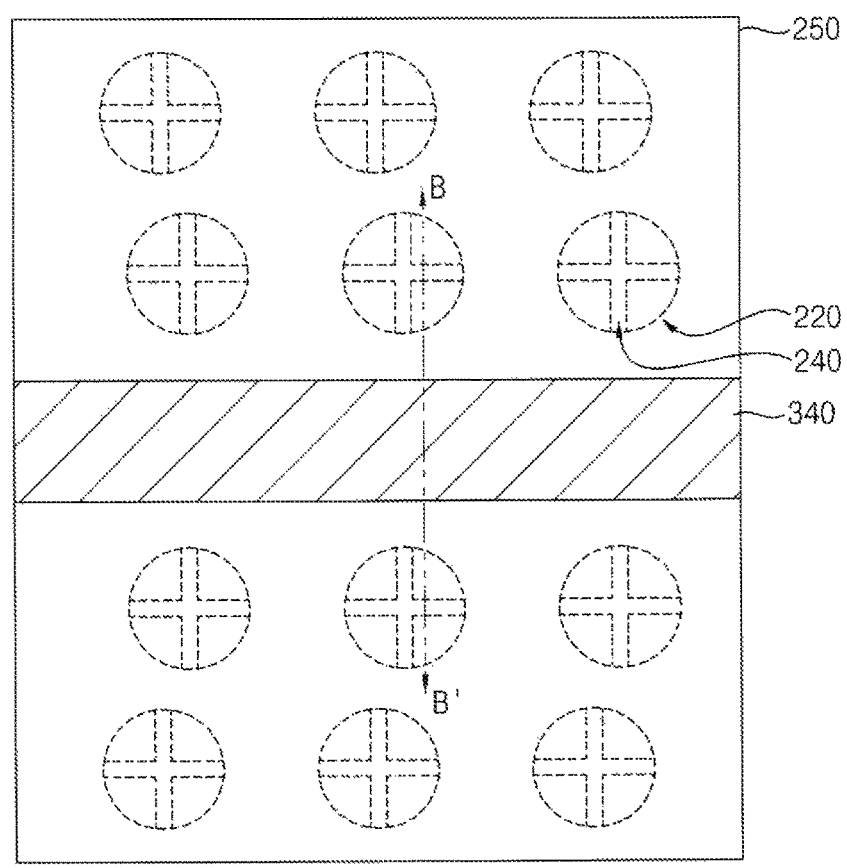
FIGS. 23 and 24 are plan and front views in cross-section showing an impurity region.
Figure 24:
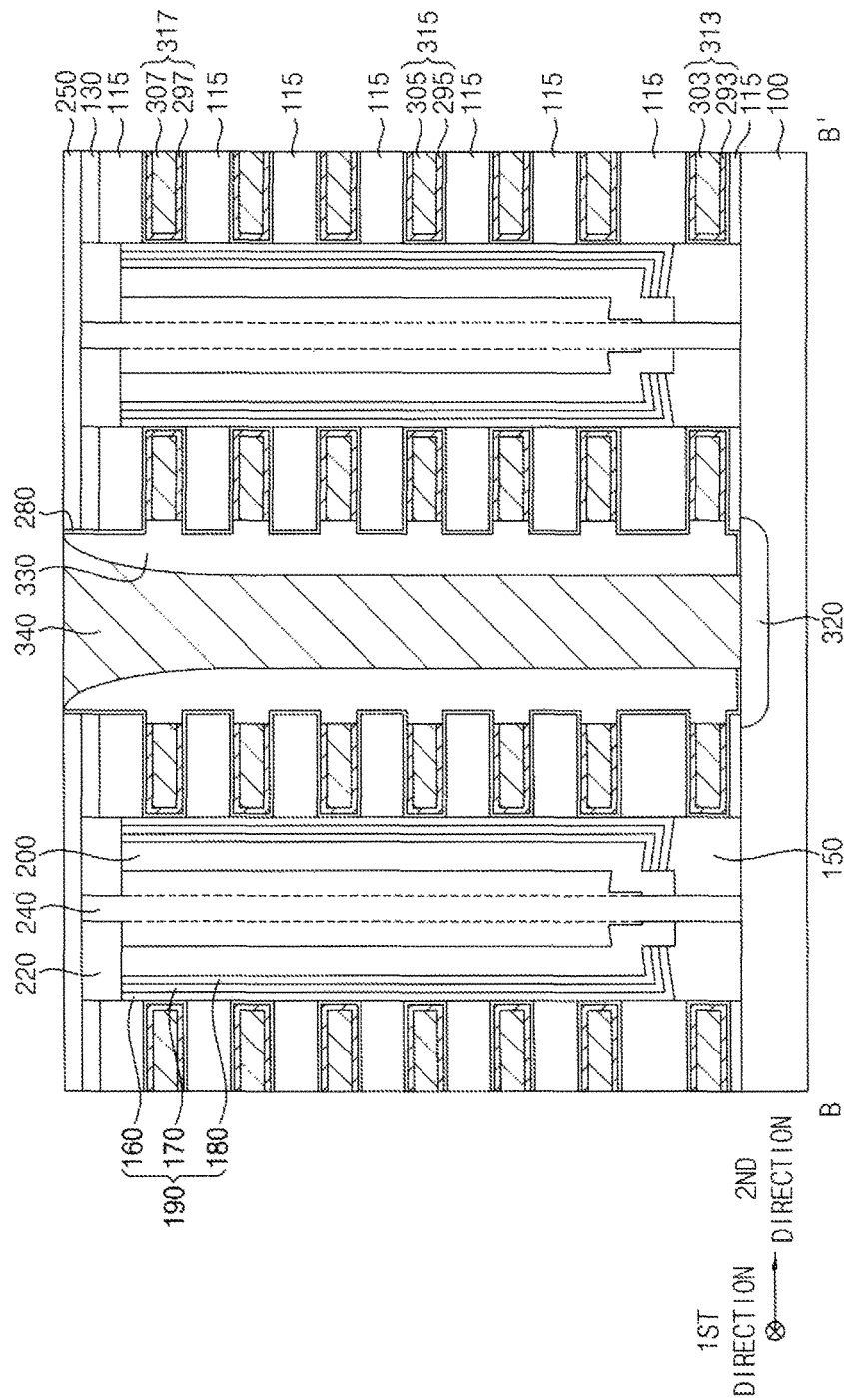

Referring now to FIGS. 23 and 24, impurities may be implanted into an upper portion of the substrate 100 exposed by the second opening 260 to form an impurity region 320 (FIG. 24). In example embodiments, the impurities may include n-type impurities, e.g., phosphorus, arsenic, etc.

A second spacer layer may be formed on the upper surface of the substrate 100 exposed by the second opening 260, a sidewall of the second opening 260, and an upper surface of the second insulating interlayer 250, and the second spacer layer may be anisotropically etched to form a second spacer 330 on the sidewall of the second opening 260. Thus, a portion of the impurity region 320 at an upper portion of the substrate 100 may be exposed. The second spacer layer may be formed of an oxide, e.g., silicon oxide.

A common source line CSL 340 may be formed on the exposed impurity region 320 to fill a remaining portion of the second opening 260.

In example embodiments, a first conductive layer may be formed on the exposed upper surface of the impurity region 320, the second spacer 330, and the second insulating interlayer 250 to sufficiently fill a remaining portion of the second opening 260, and may be planarized until an upper surface of the second insulating interlayer 250 may be exposed to form the CSL 340. A portion of the second blocking layer 280 on the second insulating interlayer 250 may be also removed. The first conductive layer may be formed of, e.g., a metal, a metal nitride and/or a metal silicide.

The CSL 340 may be formed in the second opening 260 to extend in the first direction, and may contact an upper surface of the underlying impurity region 320.

Figure 25:
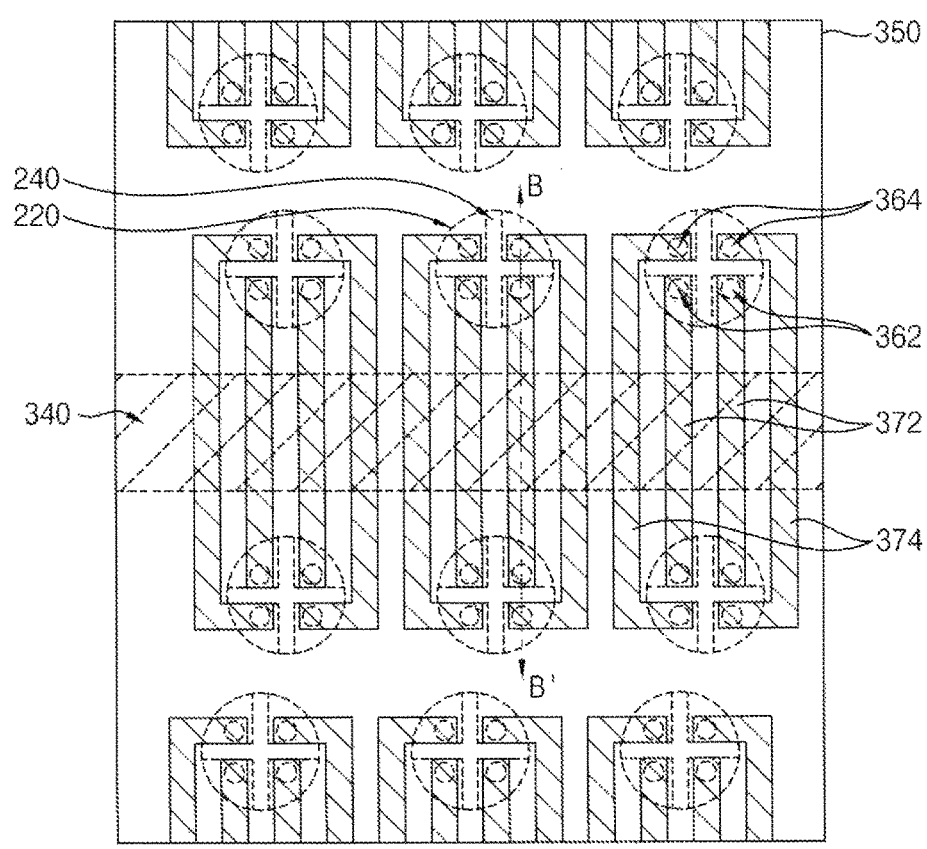
FIGS. 25 and 26 are plan and front views in cross-section showing first and second vias 362 and 364 formed through the second insulating interlayer.
Figure 26:
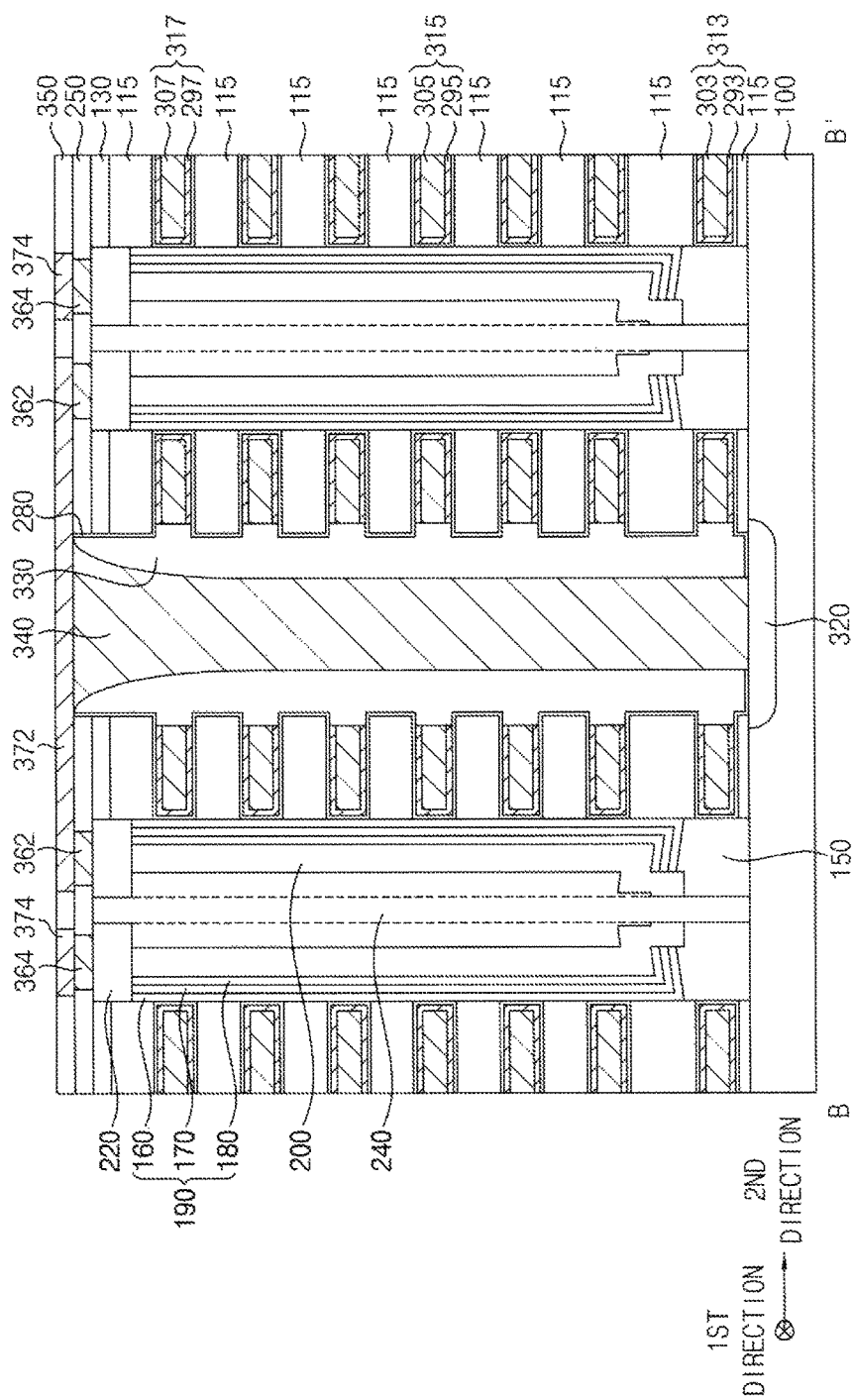

Referring to FIGS. 25 and 26, first and second vias 362 and 364 may be formed through the second insulating interlayer 250 to contact upper surfaces of the capping patterns 220, a third insulating interlayer 350 may be formed on the second insulating interlayer 250 and the first and second vias 362 and 364, and first wirings 372 extending through the third insulating interlayer 350 to contact upper surfaces of the first vias 362 and second wirings 374 extending through the third insulating interlayer 350 to contact upper surfaces of the second vias 364 may be formed.

In example embodiments, the first and second vias 362 and 364 may be formed by forming third openings (not shown) extending through the second insulating interlayer 250 to expose the upper surfaces of the capping patterns 220, forming a second conductive layer (not shown) on the exposed upper surfaces of the capping patterns 220 and the upper surface of the second insulating interlayer 250 to fill the third openings, and planarizing the second conductive layer until the upper surface of the second insulating interlayer 250 may be exposed. The first and second wirings 372 and 374 may be formed by forming fourth openings (not shown) extending through the third insulating interlayer 350 to expose the upper surfaces of the first and second vias 362 and 364, forming a third conductive layer (not shown) on the exposed upper surfaces of the first and second vias 362 and 364, the upper surface of the second insulating interlayer 250, and an upper surface of the third insulating interlayer 350 to fill the fourth openings, and planarizing the third conductive layer until the upper surface of the third insulating interlayer 350 may be exposed.

In the discussion so far, the first and second vias 362 and 364 and the first and second wirings 372 and 374 have been formed by a single damascene process, however, the inventive concepts may not be limited thereto, and thus may be also formed by a dual damascene process.

In example embodiments, each of the first wirings 372 may commonly contact the upper surfaces of the first vias 362, and each of the second wirings 374 may commonly contact the upper surfaces of the second vias 364. In an example embodiment, each of the first wirings 372 may include a first portion extending in the first direction and a second portion extending in the second direction and being connected to the first portion.

Referring back to FIGS. 1 to 3, a fourth insulating interlayer 380 may be formed on the third insulating interlayer 350 and the first and second wirings 372 and 374, and third and fourth vias 392 and 394 may be formed through the fourth insulating interlayer 380 to contact upper surfaces of the first and second wirings 372 and 374, respectively. A fifth insulating interlayer 400 may be formed on the fourth insulating interlayer 380 and the third and fourth vias 392 and 394, and third wirings 410 may be formed through the fifth insulating interlayer 400 to contact upper surfaces of the third and fourth vias 392 and 394.

The third and fourth vias 392 and 394 may be formed by a single damascene process or a dual damascene process.

In an example embodiment, each of the third and fourth vias 392 and 394 may overlap the CSL 340, however, the inventive concepts may not be limited thereto. Each of the third wirings 410 may extend in the second direction, and may contact an upper surface of at least one of the third and fourth vias 392 and 394. Each of the third wirings 410 may serve as a bit line of the vertical memory device.

As illustrated above, after forming one channel 200 in each channel hole 140, the channel 200 may be divided into a plurality of pieces (portions) by forming the division pattern 240. Thus, the density of the channel 200 may increase without increasing the area of the vertical memory device. Alternatively, when the vertical memory device has a channel density substantially the same as that of a vertical memory device including one channel in each channel hole, each of the channel holes 140 may increase, and thus failure may be prevented due to the increase of aspect ratio.

Figure 27:
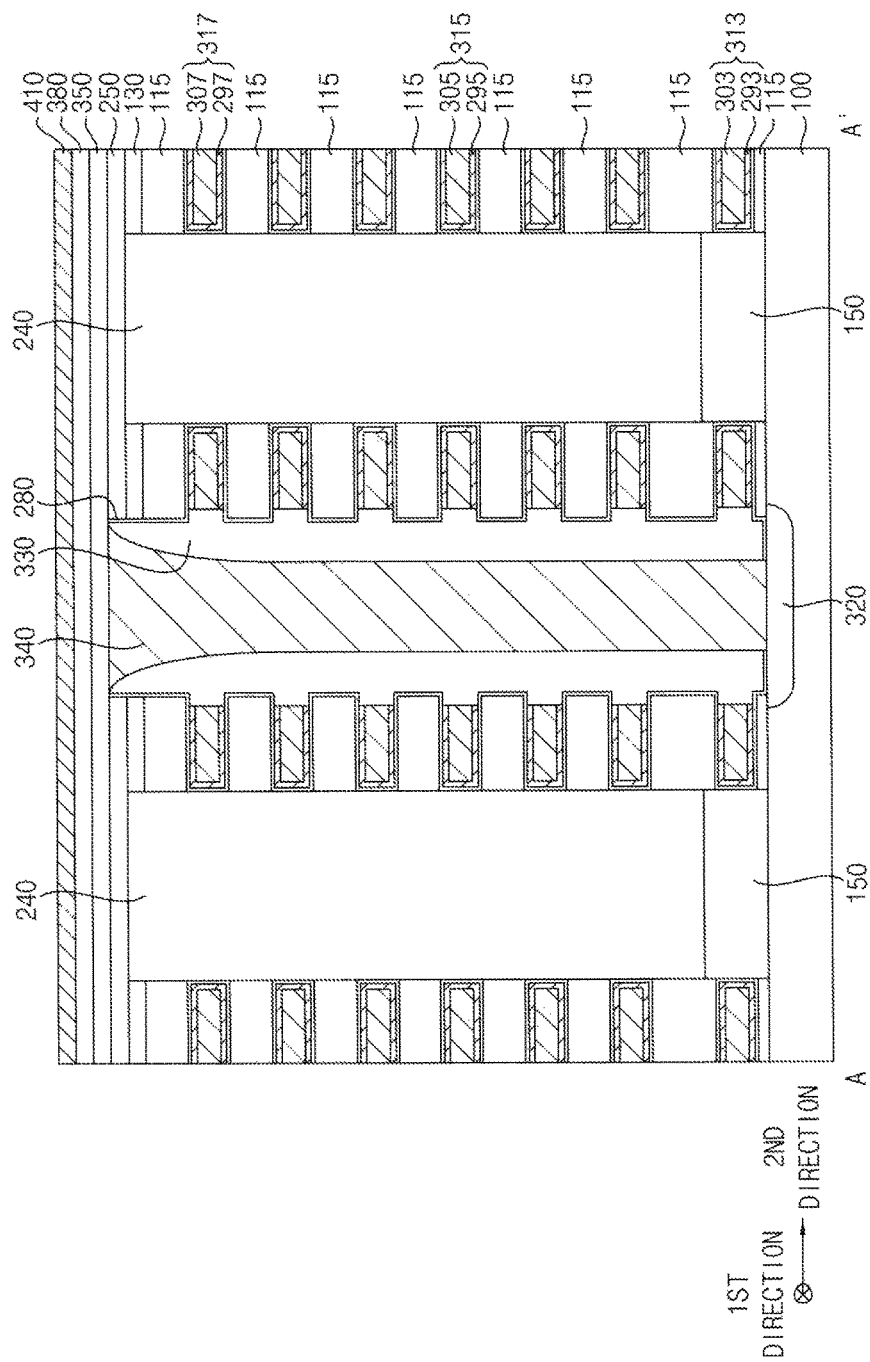
FIGS. 27 and 28 are cross-sectional views illustrating a third vertical memory device in accordance with example embodiments of the inventive concept.
Figure 28:
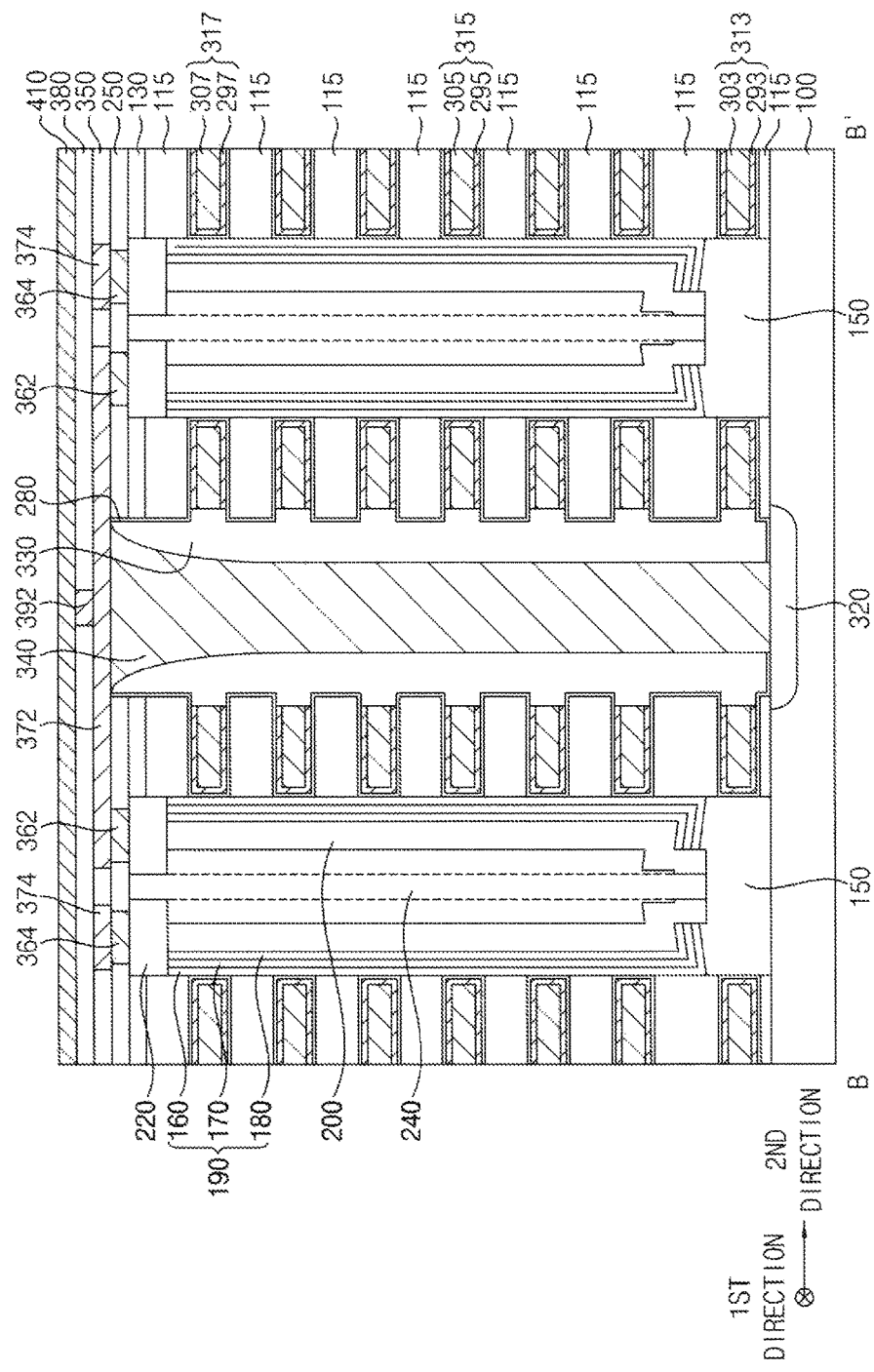

FIGS. 27 and 28 are cross-sectional views illustrating a third vertical memory device in accordance with example embodiments of the inventive concept. The third vertical memory device may be substantially the same as the first vertical memory device illustrated with reference to FIGS. 1 to 5, except for the semiconductor pattern. Thus, like reference numerals refer to like elements, and detailed descriptions thereon may be omitted below in the interest of brevity.

Referring to FIGS. 27 and 28, in the third vertical memory device, the semiconductor pattern 150 may commonly contact lower surfaces of the plurality of first structures in one channel hole 140.

For example, unlike the first vertical memory device, only one semiconductor pattern 150 of the third vertical memory device may be formed in each channel hole 140, and thus may commonly contact the lower surfaces of the plurality of first structures each including the charge storage structure 190, the channel 200, and the filling pattern 210 in one channel hole 140. Thus, the semiconductor pattern 150 may have a width greater than that of the channel 200.

As illustrated above, the first gate electrode 313 may serve as a ground selection line, the semiconductor pattern 150 may serve as a channel of the ground selection transistor (GST). Thus, when compared to the cell transistor or the string selection transistor (SST), the GST may include a channel having a relatively large width.

Figure 29:
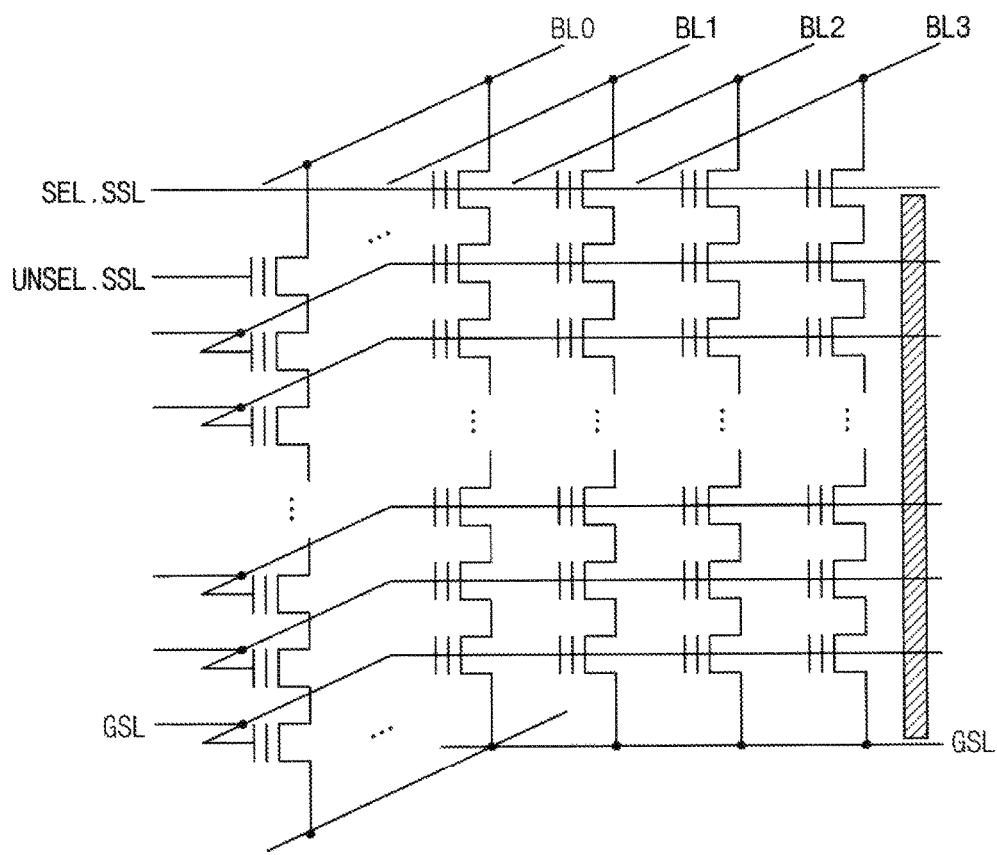
FIGS. 29 and 30 are equivalent circuit diagrams corresponding to the first and third vertical memory devices, respectively.
Figure 30:
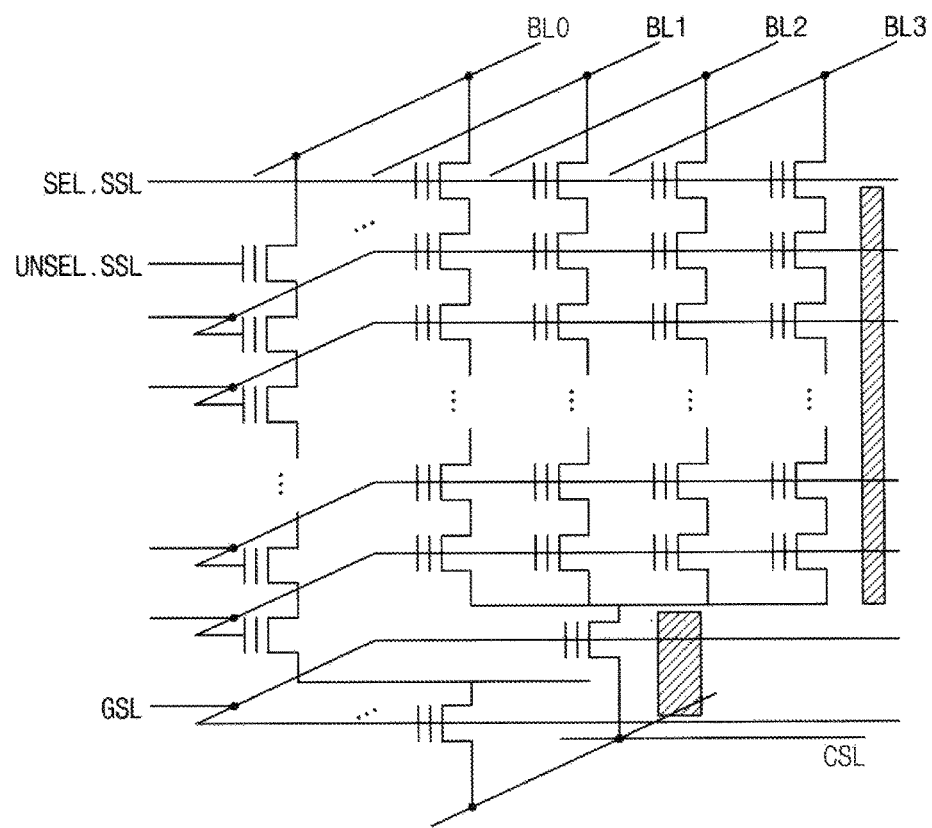

FIGS. 29 and 30 are equivalent circuit diagrams corresponding to the first and third vertical memory devices, respectively.

Referring to FIG. 29, word lines and SSLs in one string are connected to one GSL, and thus the number of a GST may be equal to the number of the string.

Referring to FIG. 30, word lines and SSLs in a plurality of strings, e.g., in four strings are connected to one GSL, and thus the number of a GST may be less than the number of the string. For example, the GSTs in four strings are merged into one GST.

As illustrated above, in the first vertical memory device, a plurality of channels nay be formed in one channel hole and correspondingly, a plurality of semiconductor patterns may be formed in the channel hole, while in the third vertical memory device, even if a plurality of channels may be formed in one channel hole, only one semiconductor pattern may be formed to commonly contact the plurality of channels in the channel hole. Thus, the GST may include a channel having a relatively large width, and the third vertical memory device may have enhanced read characteristics.

While example embodiments of the inventive concept have been particularly shown and described, it will be understood by one of ordinary skill in the art that variations in form and detail may be made therein without departing from the spirit and scope of the claims.

What is claimed is:

1. A vertical memory device, comprising:
   a mold structure including gate electrodes and insulation patterns arranged on a substrate, the gate electrodes being disposed at a plurality of levels, respectively, in a vertical direction substantially perpendicular to an upper surface of the substrate, and the insulation patterns being disposed between neighboring ones of the gate electrodes; and
   a plurality of channels arranged in a hole extending through the mold structure in the vertical direction, the plurality of channels being spaced apart from each other in a horizontal direction substantially parallel to the upper surface of the substrate in the hole,
   wherein each of the gate electrodes includes a plurality of first gate electrodes spaced apart from each other in the horizontal direction,
   and wherein the hole extends through one of the plurality of first gate electrodes included in each of the gate electrodes.

2. The vertical memory device of claim 1, wherein a division pattern extends through a hole of one of the plurality of first gate electrodes and divides the hole into a plurality of subchannels.

3. The vertical memory device of claim 1, further comprising a blocking pattern, a charge storage pattern, and a tunnel insulation pattern sequentially stacked in the horizontal direction on an inner wall of the hole,
   wherein the tunnel insulation pattern covers a sidewall of each of the plurality of channels.

4. The vertical memory device of claim 1, wherein each of the plurality of first gate electrodes extends in a first direction substantially parallel to the upper surface of the substrate, and the plurality of first gate electrodes are disposed in a second direction substantially parallel to the upper surface of the substrate and substantially perpendicular to the first direction.

5. The vertical memory device of claim 4, further comprising a plurality of holes spaced apart from each other in the first direction in one of the plurality of first gate electrodes.

6. The vertical memory device of claim 5, wherein the channels are formed in each of the plurality of holes and divided by a division pattern including an insulating material.

7. The vertical memory device of claim 6, wherein the division pattern comprises a plurality of division patterns at least partly arranged in each of the plurality of holes, respectively, and wherein the plurality of holes are spaced apart from each other.

8. The vertical memory device of claim 6, wherein the division pattern comprises a plurality of division patterns at least partly arranged in each of the plurality of holes, respectively, and the division patterns are connected with each other, respectively, and a sidewall thereof is surrounded by one of the plurality of first gate electrodes.

9. The vertical memory device of claim 4, further comprising a common source line (CSL) extending in the first direction between the plurality of first gate electrodes.

10. The vertical memory device of claim 1, further comprising a plurality of holes spaced apart from each other in the one of the plurality of first gate electrodes,
wherein only one channel is formed in each of first holes of the plurality of holes.

11. The vertical memory device of claim 1, further comprising semiconductor patterns contacting the upper surface of the substrate in the hole, the semiconductor patterns contacting lower surfaces of the channels, respectively, and being spaced apart from each other.

12. The vertical memory device of claim 1, further comprising semiconductor patterns disposed on the upper surface of the substrate in the hole, the semiconductor patterns commonly contacting lower surfaces of the channels, and upper surfaces of the semiconductor patterns being higher than one of the gate electrodes disposed at a lowermost level.

13. A vertical memory device, comprising:
gate electrodes arranged at a plurality of levels from an upper surface of a substrate in a vertical direction substantially perpendicular to the upper surface of the substrate, each one of the gate electrodes includes a plurality of first gate electrodes disposed in a horizontal direction substantially parallel to the upper surface of the substrate; and
a plurality of channels extending through one of the first gate electrodes of the gate electrodes in the vertical direction on the substrate, wherein the plurality of channels are disposed in a first channel hole column of a plurality of first channel hole columns penetrating the one of the first gate electrodes, and the channels directly contact an insulating division pattern in the first channel hole column and are spaced apart from each other by the insulating division pattern in the first channel hole column.

14. The vertical memory device of claim 13, wherein each of the plurality of first gate electrodes extends in a first direction substantially parallel to the upper surface of the substrate, and the plurality of first gate electrodes are disposed in a second direction substantially parallel to the upper surface of the substrate and substantially perpendicular to the first direction,
and wherein a plurality of the channels form a channel group, and the vertical memory device includes a plurality of channel groups spaced apart from each other in the first direction.

15. The vertical memory device of claim 13, further comprising a tunnel insulation pattern, a charge storage pattern, and a blocking pattern sequentially stacked in the horizontal direction on an inner wall of the channels,
wherein the insulating division pattern is in contact with each of opposite ends of each of the tunnel insulation pattern, the charge storage pattern and the blocking pattern.

16. The vertical memory device of claim 13, further comprising semiconductor patterns on an upper surface of the substrate, the semiconductor patterns commonly contacting lower surfaces of the channels, and upper surfaces of the semiconductor patterns being higher than one of the gate electrodes disposed at a lowermost level.

17. The vertical memory device of claim 14, wherein the plurality of channel groups form a channel hole array comprised of the plurality of first channel hole columns and a plurality of second channel hole columns spaced apart from the first channel hole columns at an acute angle with respect to the first direction or the second direction.

18. A vertical memory device, comprising:
a substrate;
a mold structure disposed on the substrate, the mold structure including gate electrodes disposed at a plurality of levels, respectively, in a vertical direction substantially perpendicular to an upper surface of the substrate, and insulation patterns disposed between neighboring ones of the gate electrodes, wherein the mold structure has a plurality of channel holes formed in the vertical direction;
wherein each of the gate electrodes includes a plurality of first gate electrodes arranged on a respective one of the plurality of levels and spaced apart from each other, and wherein one of the plurality of channel holes extends through a respective first gate electrode of the plurality of first gate electrodes; and
a division pattern respectively arranged to form a plurality of channels in the channel hole in the respective first gate electrode of the plurality of first gate electrodes, wherein the division pattern is disposed in the channel hole.

19. The vertical memory device according to claim 18, wherein the division pattern includes an insulating material.

20. The vertical memory device according to claim 18, wherein each of the gate electrodes further comprises a plurality of second gate electrodes and a plurality of third gate electrodes, wherein a respective first gate electrode, second gate electrode and third gate electrode of each of the gate electrodes are sequentially stacked.

* * * * *